US012543460B2

(12) United States Patent
Kim et al.

(10) Patent No.: US 12,543,460 B2
(45) Date of Patent: Feb. 3, 2026

(54) DISPLAY DEVICE

(71) Applicant: Samsung Display Co., LTD., Yongin-si (KR)

(72) Inventors: Sun Kwang Kim, Seoul (KR); Ki Nyeng Kang, Sejong-si (KR); Yoo Mi Ra, Ansan-si (KR); Kyung-Ho Park, Hwaseong-si (KR); Hyungjin Song, Hwaseong-si (KR); Kye Uk Lee, Seoul (KR); Hwan Young Jang, Hwaseong-si (KR)

(73) Assignee: Samsung Display Co., LTD., Yongin-si (KR)

( * ) Notice: Subject to any disclaimer, the term of this patent is extended or adjusted under 35 U.S.C. 154(b) by 381 days.

(21) Appl. No.: 18/122,245

(22) Filed: Mar. 16, 2023

(65) Prior Publication Data

US 2024/0315094 A1 Sep. 19, 2024

(30) Foreign Application Priority Data

Mar. 17, 2022 (KR) ........................ 10-2022-0033556

(51) Int. Cl.
*H10K 59/131* (2023.01)
*G09G 3/3233* (2016.01)

(52) U.S. Cl.
CPC ......... *H10K 59/131* (2023.02); *G09G 3/3233* (2013.01); *G09G 2300/0426* (2013.01);
(Continued)

(58) Field of Classification Search
CPC .. H10K 59/131; H10K 59/123; G09G 3/3233; G09G 2300/0426;
(Continued)

(56) References Cited

U.S. PATENT DOCUMENTS

2021/0143241 A1 5/2021 Kim et al.
2021/0359079 A1 11/2021 Jo et al.
2022/0199742 A1* 6/2022 Jeon .................... H10K 59/131

FOREIGN PATENT DOCUMENTS

KR 10-1621840 5/2016
KR 10-2020-0060586 6/2020
(Continued)

OTHER PUBLICATIONS

Office Action dated Oct. 18, 2025 of the corresponding Korean Patent Application No. 10-2022-0033556, 9 pages (in Korean).

*Primary Examiner* — Cuong B Nguyen

(74) *Attorney, Agent, or Firm* — F. CHAU & ASSOCIATES, LLC

(57) ABSTRACT

A display device includes: a substrate; a first conductive layer disposed on the substrate and including a data line, an initialization voltage line, and a driving voltage line; and a semiconductor layer disposed on the first conductive layer. The semiconductor layer includes a first semiconductor, a second semiconductor, and a third semiconductor spaced apart from each other, the first semiconductor is electrically connected to the driving voltage line, the second semiconductor is electrically connected to the data line, the third semiconductor is electrically connected to the initialization voltage line, and the second semiconductor does not overlap the data line in a direction perpendicular to a surface of the substrate.

20 Claims, 16 Drawing Sheets

(52) U.S. Cl.
CPC .............. *G09G 2300/0819* (2013.01); *G09G 2300/0842* (2013.01)

(58) Field of Classification Search
CPC ... G09G 2300/0819; G09G 2300/0842; H10H 20/857
See application file for complete search history.

(56) References Cited

FOREIGN PATENT DOCUMENTS

| | | | |
|---|---|---|---|
| KR | 10-2020-0077677 | A | 7/2020 |
| KR | 10-2021-0004795 | | 1/2021 |
| KR | 10-2021-0052635 | | 5/2021 |
| KR | 10-2021-0057280 | A | 5/2021 |
| KR | 10-2021-0142024 | A | 11/2021 |

* cited by examiner

CL1 : 171a, 171b, 171c, 173, 172v, 174v, 125a, 125b, 125c
CL2 : 156, 157, 174-2v, 155a, 155b, 155c
CL3 : 177a, 177b, 177c, 176a, 176b, 176c, 172h, 174h,
172-3v, 173-3v, 174-3v, 175a, 175b, 175c, 151, 151-1
ACT : 131a, 131b, 131c, 132a, 132b, 132c, 133a, 133b, 133c

CL1 : 171a, 171b, 171c, 173, 172v, 174v, 125a, 125b, 125c
CL2 : 156, 157, 174-2v, 155a, 155b, 155c
CL3 : 177a, 177b, 177c, 176a, 176b, 176c, 172h, 174h,
172-3v, 173-3v, 174-3v, 175a, 175b, 175c, 151, 151-1
ACT : 131a, 131b, 131c, 132a, 132b, 132c, 133a, 133b, 133c

DISPLAY DEVICE

CROSS-REFERENCE TO RELATED APPLICATION(S)

This application claims priority to and the benefits of Korean Patent Application No. 10-2022-0033556 under 35 U.S.C. § 119, filed on Mar. 17, 2022, in the Korean Intellectual Property Office (KIPO), the entire contents of which are incorporated herein by reference.

BACKGROUND

1. Technical Field

Embodiments relate to a display device.

2. Description of the Related Art

A display device is a device for displaying an image, and includes a liquid crystal display (LCD), an organic light emitting diode (OLED) display, and the like. The display device is used in various electronic devices such as a mobile phone, a navigation device, a digital camera, an electronic book, a portable game machine, and various terminals.

Since the OLED display has a self-luminance characteristic and does not require an additional light source unlike the LCD, thickness and weight of the OLED display may be reduced. The OLED display has high-quality characteristics such as low power consumption, high luminance, and high response speed.

The above information disclosed in this Background section is only for enhancement of understanding of the background of the invention, and therefore it may contain information that does not constitute prior art.

SUMMARY

Embodiments provide a display device capable of preventing and minimizing breakage of a semiconductor layer and penetration of hydrogen.

However, embodiments of the disclosure are not limited to those set forth herein. The above and other embodiments will become more apparent to one of ordinary skill in the art to which the disclosure pertains by referencing the detailed description of the disclosure given below.

In an embodiment, a display device may include: a substrate; a first conductive layer disposed on the substrate and including a data line, an initialization voltage line, and a driving voltage line; and a semiconductor layer disposed on the first conductive layer, wherein the semiconductor layer may include a first semiconductor, a second semiconductor, and a third semiconductor spaced apart from each other, the first semiconductor may be electrically connected to the driving voltage line, the second semiconductor may be electrically connected to the data line, the third semiconductor may be electrically connected to the initialization voltage line, and the second semiconductor may not overlap the data line in a direction perpendicular to a surface of the substrate.

The display device may further include: a second conductive layer disposed on the semiconductor layer; and a third conductive layer disposed on the second conductive layer and including a connecting member, wherein the connecting member may overlap both the second semiconductor and the data line, and the second semiconductor and the data line may be electrically connected through the connecting member.

The data line may extend along a second direction, and the connecting member may extend along a first direction intersecting the second direction.

The driving voltage line may extend along a second direction, and the third conductive layer may further include an upper storage electrode disposed between the data line and the driving voltage line in a plan view, and the upper storage electrode may include a protrusion protruding in a first direction crossing the second direction.

The protrusion of the upper storage electrode may extend to cross the driving voltage line.

The protrusion of the upper storage electrode may be electrically connected to the third semiconductor.

The third semiconductor may not overlap the driving voltage line.

The third semiconductor may overlap the initialization voltage line and may be electrically connected to the initialization voltage line.

An edge of the third semiconductor may overlap the initialization voltage line and the third conductive layer.

The third conductive layer may further include an initialization voltage connecting portion overlapping the initialization voltage line, and an edge of the third semiconductor may overlap the initialization voltage line and the initialization voltage connecting portion.

An edge of the first semiconductor may overlap the driving voltage line overlap and the third conductive layer.

The third conductive layer may include a driving voltage connecting portion overlapping the driving voltage line, and an edge of the first semiconductor may overlap the driving voltage line and the driving voltage connecting portion.

The first conductive layer may further include a lower storage electrode overlapping the upper storage electrode, and a side of the lower storage electrode may be disposed inside a boundary of the upper storage electrode in a plan view.

An edge of the first semiconductor may overlap the lower storage electrode and the upper storage electrode.

In an embodiment, a display device may include: a substrate; a first conductive layer disposed on the substrate and including a data line, an initialization voltage line, and a driving voltage line; a semiconductor layer disposed on the first conductive layer; and a third conductive layer disposed on the semiconductor layer and including a cover member, wherein the semiconductor layer may include a first semiconductor, a second semiconductor, and a third semiconductor spaced apart from each other, the first semiconductor may be electrically connected to the driving voltage line, the second semiconductor may be electrically connected to the data line, the third semiconductor may be electrically connected to the initialization voltage line, and an edge of the first semiconductor may overlap the driving voltage line and the cover member.

The cover member may not be electrically connected to the first conductive layer.

An edge of the third semiconductor may overlap the initialization voltage line and the cover member.

The third semiconductor may not overlap the driving voltage line.

The first conductive layer may further include an upper storage electrode disposed between the data line and the driving voltage line in a plan view, the upper storage electrode may include a protrusion, and the protrusion of the upper storage electrode may overlap the third semiconductor.

The second semiconductor may not overlap the first conductive layer.

According to the embodiments, a display device that may minimize breakage of a semiconductor layer and penetration of hydrogen may be provided.

DETAILED DESCRIPTION OF THE EMBODIMENTS

Figure 1:
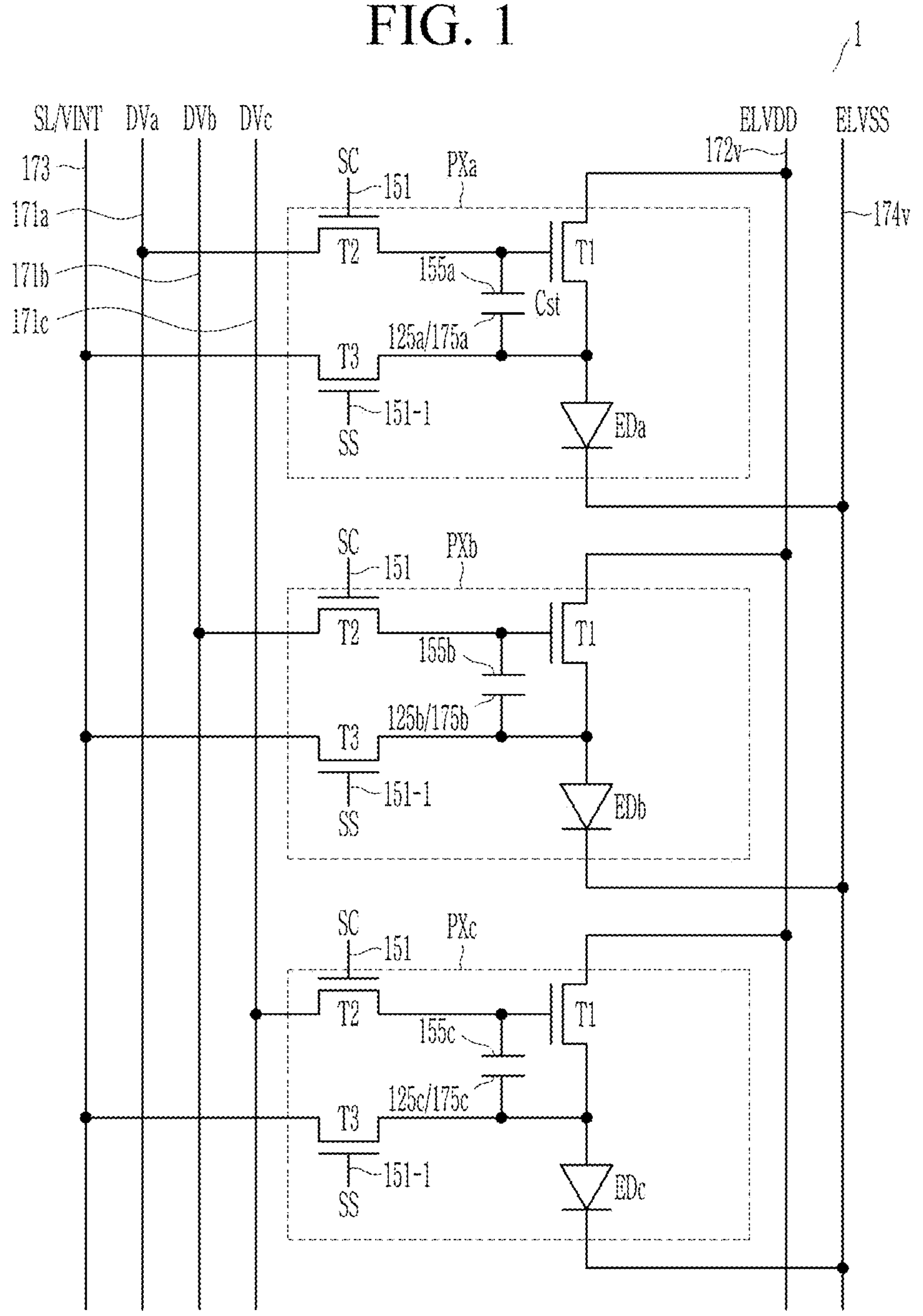
FIG. 1 illustrates a schematic diagram of an equivalent circuit of a pixel of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Various embodiments do not have to be exclusive nor limit the disclosure. For example, specific shapes, configurations, and characteristics of an embodiment may be used or implemented in an embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

FIG. 1 illustrates a schematic diagram of an equivalent circuit of a pixel of a display device 1 (e.g., a light emitting display device) according to an embodiment.

FIG. 1 illustrates a schematic diagram of equivalent circuits of three pixels PXa, PXb, and PXc including a group of light emitting diodes EDa, EDb, and EDc.

The pixels may include a first pixel PXa, a second pixel PXb, and a third pixel PXc. Each of the first pixel PXa, the second pixel PXb, and the third pixel PXc may include transistors T1, T2, and T3, a storage capacitor Cst, and light emitting diodes EDa, EDb, and EDc that are light emitting elements. Each of the pixels PXa. PXb, and PXc may be divided into the light emitting diode EDa, EDb, or EDc and a pixel circuit part. The pixel circuit part may include the transistors T1, T2, and T3 and the storage capacitor Cst in FIG. 1. In some embodiments, a light emitting capacitor connected to respective end portions of the light emitting diode EDa, EDb, or EDc may be further included, and the light emitting capacitor may not be included in the pixel circuit part, and may be included in the light emitting diode EDa, EDb, or EDc.

The transistors T1, T2, and T3 may include one driving transistor T1 (also referred to as a first transistor) and two switching transistors T2 and T3. The two switching transistors T2 and T3 may be classified into an input transistor T2 (also referred to as a second transistor) and an initialization transistor T3 (also referred to as a third transistor). Each of the transistors T1, T2, and T3 may include a gate electrode, a first electrode, and a second electrode, and may include a semiconductor layer ACT including a channel, so that a current may flow in or may not flow in the channel of the semiconductor layer ACT according to a voltage of the gate electrode. According to voltages applied to respective transistors T1, T2, and T3, one of the first electrode and the second electrode may be a source electrode and another thereof may be a drain electrode.

The gate electrode of the driving transistor T1 may be connected to an end portion of the storage capacitor Cst, and may be also connected to the second electrode (output side electrode) of the input transistor T2. The first electrode of the driving transistor T1 may be connected to a driving voltage line 172*v* that transmits a driving voltage ELVDD, and the second electrode of the driving transistor T1 may be connected to an anode of the light emitting diode EDa, EDb, or EDc, another end portion of the storage capacitor Cst, and the first electrode of the initialization transistor T3. The gate electrode of the driving transistor T1 may receive a data voltage DVa, DVb, or DVc according to a switching operation of the input transistor T2, and a driving current may be supplied to the light emitting diode EDa, EDb, or EDc according to the voltage of the gate electrode thereof. For example, the storage capacitor Cst may store and maintain the voltage of the gate electrode of the driving transistor T1.

The gate electrode of the input transistor T2 may be connected to a first scan signal line 151 that transmits a first scan signal SC. The first electrode of the input transistor T2 may be connected to a data line 171*a*, 171*b*, or 171*c* that transmits the data voltage DVa, DVb, or DVc, and the second electrode of the input transistor T2 may be connected to an end portion of the storage capacitor Cst and the gate electrode of the driving transistor T1. Data lines 171*a*, 171*b*, and 171*c* may transmit different data voltages DVa, DVb, and DVc, respectively. The input transistors T2 of the pixels PXa, PXb, and PXc may be respectively connected to different data lines 171*a*, 171*b*, and 171*c*. The gate electrodes of the input transistors T2 of the pixels PXa, PXb, and PXc may be connected to the same first scan signal line 151 to receive the first scan signal SC at the same timing. In case that the input transistors T2 of the pixels PXa, PXb, and PXc are simultaneously turned on by the first scan signal SC at the same timing, the different data voltages DVa, DVb, and DVc may be applied to the gate electrodes of the driving transistors T1 of the pixel PXa, PXb, and PXc and an end portion of the storage capacitor Cst through the different data lines 171*a*, 171*b*, and 171*c*.

The embodiment of FIG. 1 is an embodiment in which the gate electrodes of the initialization transistor T3 and the input transistor T2 receives different scan signals.

The gate electrode of the initialization transistor T3 may be connected to a second scan signal line 151-1 that transmits a second scan signal SS. The first electrode of the initialization transistor T3 may be connected to another end portion of the storage capacitor Cst, the second electrode of the driving transistor T1, and the anode of the light emitting diode EDa, EDb, or EDc, and the second electrode of the initialization transistor T3 may be connected to an initialization voltage line 173 that transmits an initialization voltage VINT. The initialization transistor T3 may be turned on according to the second scan signal SS to transmit the initialization voltage VINT to the anode of the light emitting diode EDa, EDb, or EDc and another end portion of the storage capacitor Cst to initialize the voltage of the anode of the light emitting diode EDa, EDb, or EDc.

The initialization voltage line 173 may perform an operation to sense a voltage of the anode of the light emitting diode EDa, EDb, or EDc before applying the initialization voltage VINT, so that it may function as a sensing wire SL. Through the sensing operation, whether the anode voltage is maintained at a target voltage may be checked. The sensing operation and the initialization operation of transmitting the initialization voltage VINT may be performed separately in different times, and for example, the initialization operation may be performed after the sensing operation is performed.

In the embodiment of FIG. 1, turn-on periods of the initialization transistor T3 and of the input transistor T2 may be separated (may not overlap each other), so that a writing operation performed by the input transistor T2 and an initialization operation (and/or sensing operation) performed by the initialization transistor T3 may be performed at different timings.

Figure 2:
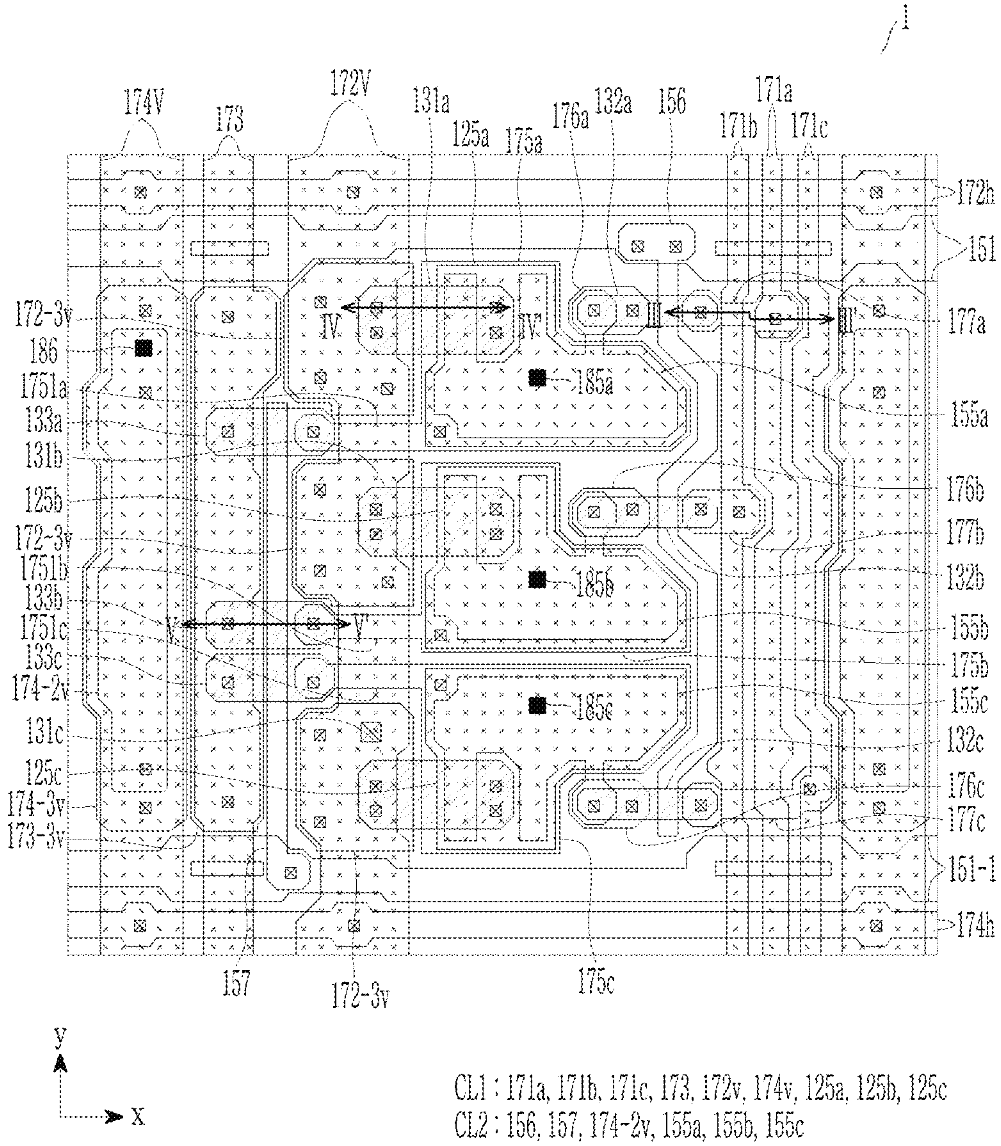
FIG. 2 illustrates a schematic top plan view of a portion of a display device according to an embodiment.

An end portion of the storage capacitor Cst may be connected to the gate electrode of the driving transistor T1 and the second electrode of the input transistor T2, and another end portion of the storage capacitor Cst may be connected to the first electrode of the initialization transistor T3, the second electrode of the driving transistor T1, and the anode of the light emitting diode EDa, EDb, or EDc. In FIG. 1, reference numerals are denoted at an end portion and another end portion of the storage capacitor Cst, and this is to clearly indicate which part corresponds to the storage capacitor Cst in FIG. 2 and the like. For example, an end portion of the storage capacitor Cst may be integral with a gate electrode 155*a*, 155*b*, or 155*c* of the driving transistor T1, and another end portion of the storage capacitor Cst may be positioned at a lower storage electrode 125*a*, 125*b*, or 125*c* and an upper storage electrode 175*a*, 175*b*, or 175*c*. Referring to FIG. 2, in the cross-sectional structure of the storage capacitor Cst, the lower storage electrodes 125*a*, 125*b*, and 125*c* may be positioned at a lowermost portion thereof, and the gate electrodes 155*a*, 155*b*, and 155*c* of the driving transistors T1 may be insulated and positioned thereon, in case that the upper storage electrodes 175*a*, 175*b*, and 175*c* are insulated and positioned thereon. Insulating layers 120, 140, and 160 positioned between these three layers may function as dielectric layers, and the lower storage electrodes 125*a*, 125*b*, and 125*c* and the upper storage electrodes 175*a*, 175*b*, and 175*c* may be connected (e.g., electrically connected to each other to have the same voltage.

A cathode of the light emitting diode EDa, EDb, or EDc may receive a driving low voltage ELVSS through a driving low voltage line 174*v*, and the light emitting diode EDa, EDb, or EDc may emit light according to an output current of the driving transistor T1 to display a gray.

In an embodiment, light emitting capacitors may be formed at respective end portions of the light emitting diodes EDa, EDb, and EDc, so that voltages at respective end portions of the light emitting diodes EDa, EDb, and EDc may be maintained constant so that the light emitting diodes EDa, EDb, and EDc may display a constant luminance.

Hereinafter, an operation of a pixel having the circuit as shown in FIG. 1 will be described.

FIG. 1 illustrates that each transistor T1, T2, or T3 is an N-type transistor, and each transistor T1, T2, or T3 is turned on in case that a high level voltage is applied to the gate electrode thereof. However, in some embodiments, each transistor T1, T2, or T3 may be a P-type transistor.

One frame may start in case that a light emitting period ends. After that, a high level second scan signal SS is supplied to turn on the initialization transistor T3. In case that the initialization transistor T3 is turned on, an initialization operation and/or a sensing operation may be performed.

The initialization operation and the sensing operation are performed will be described.

The sensing operation may be performed before the initialization operation is performed. For example, as the initialization transistor T3 is turned on, the initialization voltage line 173 may function as the sensing wire SL to sense a voltage of the anode of the light emitting diode EDa, EDb, or EDc. Through the sensing operation, whether the anode voltage is maintained at a target voltage may be checked.

For example, the initialization operation may be performed, and the voltages of another end portion of the storage capacitor Cst, the second electrode of the driving transistor T1, and the anode of the light emitting diode EDa, EDb, or EDc may be changed to the initialization voltage VINT transmitted from the initialization voltage line 173, thereby performing the initialization.

As described above, the sensing operation and the initialization operation for transmitting the initialization voltage VINT may be time-divided and performed, so that the pixel may perform various operations with using a minimum number of transistors and reducing an area occupied by the pixel. As a result, a resolution of the display panel may be improved.

The first scan signal SC may be also applied with being changed to a high level together with the initialization operation or at separate timing, so that the input transistor T2 may be turned on, and a writing operation may be performed. For example, the data voltage DVa, DVb, or DVc from the data lines 171*a*, 171*b*, or 171*c* through the turned-on input transistor T2 may be inputted and stored to the gate electrode of the driving transistor T1 and an end portion of the storage capacitor Cst.

The data voltage DVa, DVb, or DVc and the initialization voltage VINT may be applied to respective end portions of the storage capacitor Cst by the initialization operation and the writing operation, respectively. In the state in which the initialization transistor T3 is turned on, in case that an output current is generated from the driving transistor T1, the output current may be outputted to the outside through the initialization transistor T3 and the initialization voltage line 173, so that the output current may not be inputted to the light emitting diode EDa, EDb, or EDc. In some embodiments, during the writing period in which the high level first scan signal SC is supplied, the driving voltage ELVDD may be applied as a low level voltage, or the driving low voltage ELVSS may be applied as a high level voltage, so that a current from flowing through the light emitting diode EDa, EDb, or EDc may be prevented.

After that, in case that the first scan signal SC is changed to a low level, the driving transistor T1 may generate and output an output current by the high level driving voltage ELVDD applied to the driving transistor T1 and the gate voltage of the driving transistor T1 stored in the storage capacitor Cst. The output current of the driving transistor T1 may be inputted to the light emitting diode EDa, EDb, or EDc, so that a light emitting period in which the light emitting diode EDa, EDb, or EDc emits light may proceed.

Figure 3:
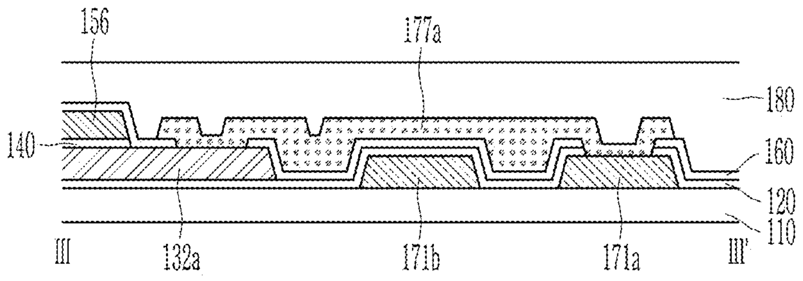
FIG. 3 illustrates a schematic cross-sectional view of a display device taken along line III-III' of FIG. 2.
Figure 4:
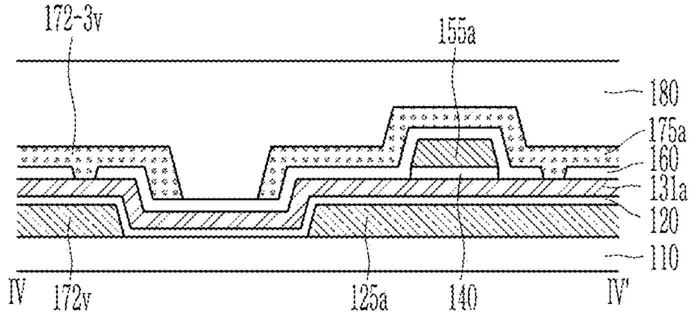
FIG. 4 illustrates a schematic cross-sectional view of a display device taken along line IV-IV' of FIG. 2.
Figure 5:
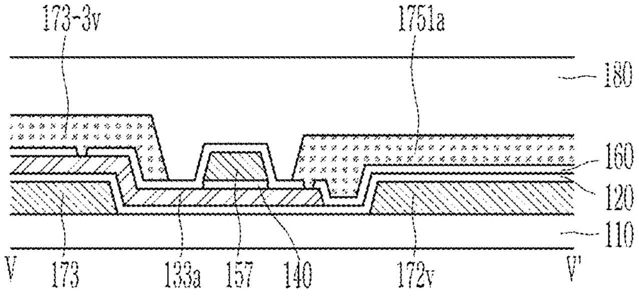
FIG. 5 illustrates a schematic cross-sectional view of a display device taken along line V-V' of FIG. 2.

A detailed structure of the pixel circuit part among the pixels PXa, PXb, and PXc having the circuit structure as shown in FIG. 1 will be described with reference to FIG. 2 to FIG. 5. FIG. 2 illustrates a schematic top plan view of a portion of a display device 1 according to an embodiment, FIG. 3 illustrates a schematic cross-sectional view of a display device 1 taken along line III-III' of FIG. 2, and FIG. 4 illustrates a schematic cross-sectional view of a display device 1 taken along line IV-IV' of FIG. 2. FIG. 5 illustrates a schematic cross-sectional view of a display device 1 taken along line V-V' of FIG. 2.

As illustrated in FIG. 2, respective pixel circuit parts may be arranged in a y-axis direction. Referring to FIG. 2, a first pixel circuit part included in the first pixel PXa may be positioned at an uppermost portion, a second pixel circuit part included in the second pixel PXb may be positioned therebelow, and a third pixel circuit part included in the third pixel PXc may be positioned at a lowermost portion. Hereinafter, three pixels PXa, PXb, and PXc may be also referred to as a group of pixels.

First, a stacked structure of the display device 1 will be schematically described with reference to FIG. 2 to FIG. 5.

The display device 1 according to an embodiment may include a first substrate 110. The first substrate 110 may include an insulating material such as glass, plastic, or the like, and may have flexibility.

A first conductive layer CL1, a first insulating layer 120, a semiconductor layer ACT, a second insulating layer 140, a second conductive layer CL2, a third insulating layer 160, a third conductive layer CL3, and a fourth insulating layer 180 may be sequentially formed (or stacked) on the first substrate 110. The first insulating layer 120, the second insulating layer 140, and the third insulating layer 160 may be inorganic insulating layers including an inorganic insulating material, and the fourth insulating layer 180 may be an organic insulating layer including an organic insulating material. In some embodiments, each insulating layer may be formed as layers, and in some embodiments, the third insulating layer 160 may be an organic insulating layer. The inorganic insulating material may include a silicon nitride (SiNx), a silicon oxide (SiOx), and a silicon oxynitride (SiOxNy), and the organic insulating material may include polyimide, an acryl-based polymer, a siloxane-based polymer, and the like. The first conductive layer CL1, the second conductive layer CL2, and the third conductive layer CL3 may include at least one of copper (Cu), aluminum (Al), magnesium (Mg), silver (Ag), gold (Au), platinum (Pt), palladium (Pd), nickel, (Ni), neodymium (Nd), iridium (Ir), molybdenum (Mo), tungsten (W), titanium (Ti), chromium (Cr), tantalum (Ta), and alloys thereof. Each of the first conductive layer CL1, the second conductive layer CL2, and the third conductive layer CL3 may be formed as a single layer or a multilayer. For example, each of the first conductive layer CL1, the second conductive layer CL2, and the third conductive layer CL3 may have a multilayer structure including a lower layer including titanium and an upper layer including copper. For example, the semiconductor layer ACT may include a semiconductor material such as amorphous silicon, polysilicon, or an oxide semiconductor. In an embodiment, a semiconductor layer ACT including an oxide semiconductor will be described. The second insulating layer 140 and the second conductive layer CL2 may be formed by the same process, and may have the same planar shape as each other. For example, the second insulating layer 140 may be positioned to overlap the second conductive layer CL2.

Hereinafter, each constituent element included in the pixel circuit part among a group of pixels will be described in detail with reference to FIG. 2 to FIG. 5.

The first scan signal line 151 may extend in an x-axis direction, may be formed one for each pixel circuit part of a group, and may be formed in the third conductive layer CL3 as a single layer. For example, a second scan signal line 151-1 may extend in the x-axis direction, may be formed one for each pixel circuit part of a group, and may be formed in the third conductive layer CL3 as a single layer. For example, in the embodiments, the first scan signal line 151 and the second scan signal line 151-1 may be formed of layers such as a double-layered structure.

The first scan signal line 151 may be connected (e.g., electrically connected) to a gate electrode 156 positioned (or included) in the second conductive layer CL2 through an opening. The first scan signal SC may be transmitted (or applied) along the first scan signal line 151, and simultaneously may control the input transistors T2 included in a group of pixel circuits through the gate electrode 156 connected (e.g., electrically connected) to the first scan signal line 151.

For example, the second scan signal line 151-1 may be connected (e.g., electrically connected) to a gate electrode 157 positioned (or included) in the second conductive layer CL2 through an opening. The second scan signal SS may be transmitted along the second scan signal line 151-1, and simultaneously may control the input transistors T3 included in a group of pixel circuits through the gate electrode 157 connected (e.g., electrically connected) to the second scan signal line 151-1.

The data lines 171*a*, 171*b*, and 171*c* may extend in the y-axis direction, and three data lines 171*a*, 171*b*, and 171*c* may be all positioned at a side (e.g., a right side in FIG. 2) of the pixel circuit part. The data lines 171*a*, 171*b*, and 171*c* may have a single-layered structure, and may be positioned (or included) in the first conductive layer CL1. In some embodiments, the data lines 171*a*, 171*b*, and 171*c* may be formed of layers, such as a double-layered structure.

The data lines 171*a*, 171*b*, and 171*c* may be connected (e.g., electrically connected) to second semiconductors 132*a*, 132*b*, and 132*c* through connecting members 177*a*, 177*b*, and 177*c* positioned (or included) in the third conductive layer CL3, respectively. Through the above-described structure, in case that three pixels PXa, PXb, and PXc included in a group of pixels are controlled by one first scan signal line 151, different data voltages DVa, DVb, and DVc may be applied thereto through different data lines 171*a*, 171*b*, and 171*c*. Accordingly, the light emitting diodes EDa, EDb, and EDc respectively included in the pixels PXa, PXb, and PXc may display different luminance.

The connecting members 177*a*, 177*b*, and 177*c* may be positioned (or extend) along the x-axis direction so that the second semiconductors 132*a*, 132*b*, and 132*c* and the data lines 171*a*, 171*b*, and 171*c* may be connected and may not overlap each other. Accordingly, a problem that the semiconductor layer ACT is broken or the inorganic insulating layer (e.g., 120, 140, or 160) on the semiconductor layer ACT is broken due to a step (or step difference) of the first conductive layer CL1 may be solved or prevented in case that the semiconductor layer ACT passes over the first conductive layer CL1. Specific configurations and effects will be separately described below.

The driving voltage line 172*v* transmitting the driving voltage ELVDD may include a driving voltage line 172*v* extending in the y-axis direction and an additional driving voltage line 172*h* extending in the x-axis direction. The additional driving voltage line 172*h* may be positioned (or included) in the third conductive layer CL3 like an additional driving low voltage line 174*h* to be described below.

For example, according to this embodiment, the driving voltage line 172*v* positioned (or included) in the first conductive layer CL1 may be connected (e.g., electrically connected) to the additional driving voltage line 172*h* positioned (or included) in the third conductive layer CL3 through an opening formed in (or passing through) the first insulating layer 120 and the third insulating layer 160. Thus, a voltage of the driving voltage ELVDD may be prevented from dropping at a specific position by transmitting the driving voltage ELVDD in the x-axis direction and the y-axis direction.

According to the embodiment of FIG. 2, the driving voltage line 172*v* extending in the y-axis direction may be formed as the first conductive layer CL1, and may have a double layered structure in a partial section. For example, a driving voltage connecting portion 172-3*v* positioned (or included) in the third conductive layer CL3 may be further included on the driving voltage line 172*v* positioned (or included) in the first conductive layer CL1. The driving voltage connecting portion 172-3*v* may be connected (e.g., electrically connected) to the driving voltage line 172*v* through the opening formed in (or passing through) the first insulating layer 120 and the third insulating layer 160, so that since the driving voltage ELVDD may be transmitted to the double layer of the driving voltage line 172*v* and the driving voltage connecting portion 172-3*v* in a partial section, wire resistance may be reduced. The driving voltage connecting portion 172-3*v* may connect (e.g., electrically connect) the driving voltage line 172*v* to the first semiconductors 131*a*, 131*b*, and 131*c* through an opening formed in (or passing through) the third insulating layer 160 so that the driving voltage ELVDD may be transmitted to the first semiconductors 131*a*, 131*b*, and 131*c*. As shown in FIG. 2, the driving voltage connecting portions 172-3*v* may be positioned to be spaced apart from each other.

Although separately described below, protrusions 1751*a*, 1751*b*, and 1751*c* of the upper storage electrodes 175*a*, 175*b*, and 175*c* may be positioned between the driving voltage connecting portions 172-3*v* spaced apart from each other. The protrusions 1751*a*, 1751*b*, 1751*c* may allow third semiconductors 133*a*, 133*b*, and 133*c* to not overlap the driving voltage line 172*v* and to be connected (e.g., electrically connected) to the upper storage electrodes 175*a*, 175*b*, and 175*c*.

The initialization voltage line 173 that transmits the initialization voltage VINT may be positioned at the left side of the pixel circuit part, may be positioned (or included) in the first conductive layer CL1, and may extend in the y-axis direction. The initialization voltage line 173 may include a section having a double-layered structure. For example, an initialization voltage connecting portion 173-3*v* positioned (or included) in the third conductive layer CL3 may be further formed on the initialization voltage line 173 positioned (or included) in the first conductive layer CL1. The initialization voltage connecting portion 173-3*v* may be connected (e.g., electrically connected) to the initialization voltage line 173 through the opening formed in (or passing through) the first insulating layer 120 and the third insulating layer 160. Since the initialization voltage VINT is transmitted to the double layer of the initialization voltage line 173 and the initialization voltage connecting portion 173-3*v* in a partial section, the wire resistance may be reduced. The initialization voltage connecting portion 173-3*v* may be connected (e.g., electrically connected) to the third semiconductors 133*a*. 133*b*, and 133*c* through the opening formed in (or passing through) the third insulating layer 160 so that the initialization voltage VINT may be transmitted to the third semiconductors 133*a*, 133*b*, and 133*c*.

Referring to the embodiment of FIG. 2, the driving low voltage line 174*v* that transmits the driving low voltage ELVSS applied to the cathode of the light emitting diode EDa, EDb, or EDc may be formed in the pixel circuit part.

The driving low voltage line 174*v* that transmits the driving low voltage ELVSS may include a driving low voltage line 174*v* extending in the y-axis direction and an additional driving low voltage line 174*h* extending in the x-axis direction. The driving low voltage line 174*v* positioned (or included) in the first conductive layer CL1 may be connected (e.g., electrically connected) to the additional driving low voltage line 174*h* positioned (or included) in the third conductive layer CL3 through the opening formed in (or passing through) the first insulating layer 120 and the third insulating layer 160. Thus, a voltage of the driving low voltage ELVSS may be prevented from dropping at a specific position by transmitting the driving low voltage ELVSS in the x-axis direction and the y-axis direction.

The driving low voltage line 174*v* may include a section having a triple-layered structure. For example, on the driving low voltage line 174*v* positioned (or included) in the first conductive layer CL1, a portion 174-2*v* positioned (or included) in the second conductive layer CL2 and a portion 174-3*v* positioned (or included) in the third conductive layer CL3 may be connected (e.g., electrically connected) through an opening. For example, the driving low voltage line 174*v* may be connected (e.g., electrically connected) to the portion 174-3*v* positioned (or included) in the third conductive layer CL3 through the opening formed in (or passing through) the first insulating layer 120 and the third insulating layer 160. For example, the portion 174-3*v* positioned (or included) in the third conductive layer CL3 may be connected (e.g., electrically connected) to the portion 174-2*v* positioned (or included) in the second conductive layer CL2 through the opening formed in (or passing through) the third insulating layer 160. In an embodiment, the driving low voltage line 174*v* positioned (or included) in the first conductive layer CL1 and the portion 174-2*v* positioned (or included) in the second conductive layer CL2 may not be directly connected, but may be connected through the portion 174-3*v* positioned (or included) in the third conductive layer CL3. According to such a triple layered structure, since the driving low voltage ELVSS is transmitted to the triple layer, wire resistance may be reduced.

The additional driving low voltage line 174*h* positioned (or included) in the third conductive layer CL3 may be connected (e.g., electrically connected) to the cathode of the light emitting diode EDa, EDb, or EDc by an opening 186 positioned in the fourth insulating layer 180, so that the driving low voltage ELVSS may be transmitted to the cathode. In some embodiments, the additional driving low voltage line 174*h* may be positioned on the fourth insulating layer 180, and may further include the cathode connecting portion for connecting the cathode of the light emitting diode EDa, EDb, or EDc.

For example, referring to FIG. 1, the driving low voltage ELVSS may also be applied to an electrode of the light emitting capacitor.

The transistors T1, T2, and T3 may have the same stacked structure, and may include the gate electrode positioned (or included) in the second conductive layer CL2, the channel positioned (or included) in the semiconductor layer ACT, and a first area and a second area positioned at respective sides of the channel and doped to have the same or similar characteristics as or to the conductor. The first area and the second area positioned in the semiconductor layer ACT may correspond to the first electrode and the second electrode described in FIG. 1.

Each transistor will be described below.

The driving transistor T1 may have a channel, a first area, and a second area in the first semiconductor 131*a*, 131*b*, or 131*c* positioned on the first insulating layer 120, and the first area and the second area may be doped to have the same or similar conductive characteristics as a conductor. The first area of the first semiconductor 131*a*, 131*b*, or 131*c* may be connected (e.g., electrically connected) to the driving voltage line 172*v* through the opening and the driving voltage connecting portion 172-3*v* to receive the driving voltage ELVDD. For example, the driving voltage line 172*v* may be connected to the driving voltage connecting portion 172-3*v* through the opening formed in (or passing through) the first insulating layer 120 and the third insulating layer 160. For example, the driving voltage connecting portion 172-3*v* may be connected (e.g., electrically connected) to the first semiconductor 131*a*, 131*b*, or 131*c* through the opening formed in (or passing through) the third insulating layer 160. For example, the second area of the first semiconductor 131*a*, 131*b*, or 131*c* may be connected (e.g., electrically connected) to the upper storage electrode 175*a*, 175*b*, or 175*c* through the opening formed in (or passing through) the third insulating layer 160. For example, the upper storage electrodes 175*a*, 175*b*, and 175*c* may be connected (e.g., electrically connected) to the lower storage electrodes 125*a*, 125*b*, and 125*c* through the openings formed in the first insulating layer 120 and the third insulating layer 160, and the upper storage electrodes 175*a*, 175*b*, and 175*c* may be connected (e.g., electrically connected) to the third semiconductors 133*a*, 133*b*, and 133*c* through the opening formed in (or passing through) the third insulating layer 160. As a result, the first semiconductors 131*a*, 131*b*, and 131*c* may be also connected (e.g., electrically connected) to the lower storage electrodes 125*a*, 125*b*, and 125*c* and the first area of the third semiconductors 133*a*, 133*b*, and 133*c*.

The gate electrodes 155*a*, 155*b*, and 155*c* may be formed on the first semiconductors 131*a*, 131*b*, and 131*c*. For example, the second insulating layer 140 may be positioned between the first semiconductors 131*a*, 131*b*, and 131*c* and the gate electrodes 155*a*, 155*b*, and 155*c*. In a plan view, a channel may be formed in the first semiconductor 131*a*, 131*b*, or 131*c* overlapping the gate electrode 155*a*, 155*b*, or 155*c*, and the channel may not be doped because it is covered by the gate electrode 155*a*, 155*b*, or 155*c*. The gate electrode 155*a*, 155*b*, or 155*c* may have a protrusion, and the protrusion may be connected (e.g., electrically connected) to the second semiconductor 132*a*, 132*b*, or 132*c* through the opening and the connecting member 176*a*, 176*b*, or 176*c*. For example, the gate electrode 155*a*, 155*b*, or 155*c* positioned (or included) in the second conductive layer CL2 may be connected (e.g., electrically connected) to the connecting member 176*a*, 176*b*, or 176*c* positioned (or included) in the third conductive layer CL3 through the opening formed in (or passing through) the third insulating layer 160, and the connecting member 176*a*, 176*b*, or 176*c* may be connected (e.g., electrically connected) to the second semiconductor 132*a*, 132*b*, or 132*c* through the opening formed in (or passing through) the third insulating layer 160. The connecting member 176*a*, 176*b*, or 176*c* and the upper storage electrode 175*a*. 175*b*, or 175*c* may be positioned on the same layer, and may be formed of the same material.

According to the embodiment of FIG. 2, the three gate electrodes 155*a*, 155*b*, and 155*c* included in the three pixels PXa, PXb, and PXc may have different planar structures.

For example, regarding the portions in which the three gate electrodes 155*a*, 155*b*, and 155*c* are connected (e.g., electrically connected) to the second semiconductors 132*a*, 132*b*, and 132*c*, the gate electrode 155*a* of the driving transistor T1 of the first pixel PXa may be connected (e.g., electrically connected) to the second semiconductor 132*a* at an upper side thereof, the gate electrode 155*b* of the driving transistor T1 of the second pixel PXb may be connected (e.g., electrically connected) to the second semiconductor 132*b* at an upper side thereof, and the gate electrode 155*c* of the driving transistor T1 of the third pixel PXc may be connected (e.g., electrically connected) to the second semiconductor 132*c* at a lower side thereof.

The structure of each of the gate electrodes 155*a*, 155*b*, and 155*c* will be described in detail as follows.

The gate electrode 155*a* of the driving transistor T1 of the first pixel PXa may include a portion overlapping the first semiconductor 131*a* and a portion that extends therefrom to form another electrode of the storage capacitor Cst with overlapping the lower storage electrode 125*a* and the upper storage electrode 175*a*. The gate electrode 155*a* of the driving transistor T1 of the first pixel PXa may protrude to further include a protrusion connected (e.g., electrically connected) to the connecting member 176*a* through the opening formed in (or passing through) the third insulating layer 160. The upper storage electrode 175*a* may include a removed portion to be able to be connected (e.g., electrically connected) to the lower storage electrode 125*a* through the opening formed in (or passing through) the first insulating layer 120 and the third insulating layer 160.

For example, a boundary line of the gate electrode 155*a* of the driving transistor T1 of the first pixel PXa may be positioned more to the inside in a plan view than a boundary line of the lower storage electrode 125*a* and/or a boundary line of the upper storage electrode 175*a* that overlap the gate electrode 155*a* except for the protrusion thereof. For example, the gate electrode 155*a* may have a structure that is protected by the lower storage electrode 125*a* and/or the upper storage electrode 175*a*, so that the lower storage electrode 125*a* and/or the upper storage electrode 175*a* may form parasitic capacitance with the pixel PXb adjacent thereto. This is because the gate electrode 155*a* of the driving transistor T1 of the first pixel PXa is covered by the lower storage electrode 125*a* and/or the upper storage electrode 175*a* positioned thereabove and therebelow, and this is because most of generated power lines are connected to the lower storage electrode 125*a* and/or the upper storage electrode 175*a* before entering (or connecting) the gate electrode 155*a*.

The gate electrode 155*b* of the driving transistor T1 of the second pixel PXb may include a portion overlapping the first semiconductor 131*b* and a portion that extends therefrom to form another electrode of the storage capacitor Cst with overlapping the lower storage electrode 125*b* and the upper storage electrode 175*b*. The gate electrode 155*b* of the driving transistor T1 of the second pixel PXb may protrude to further include a protrusion connected (e.g., electrically connected) to the connecting member 176*b* through the opening formed in (or passing through) the third insulating layer 160. The upper storage electrode 175*b* may include a removed portion to be able to be connected (e.g., electrically connected) to the lower storage electrode 125*b* through the opening formed in (or passing through) the first insulating layer 120 and the third insulating layer 160.

The boundary line of the gate electrode 155*b* of the driving transistor T1 of the second pixel PXb may be positioned more to the inside than the boundary line of the lower storage electrode 125*b* and/or the boundary line of the upper storage electrode 175*b* that overlap the gate electrode 155*b* except for the protrusion thereof in a plan view. The gate electrode 155*b* may have a structure that is protected by the lower storage electrode 125*b* and/or the upper storage electrode 175*b*, and the lower storage electrode 125*b* and/or the upper storage electrode 175*b* form parasitic capacitance with the pixels PXa and PXc adjacent thereto. This is because the gate electrode 155*b* of the driving transistor T1 of the second pixel PXb is covered by the lower storage electrode 125*b* and/or the upper storage electrode 175*b* positioned thereabove and therebelow, and this is because most of generated power lines are connected to the lower storage electrode 125*b* and/or the upper storage electrode 175*b* before entering the gate electrode 155*b*.

The gate electrode 155*c* of the driving transistor T1 of the third pixel PXc may include a portion overlapping the first semiconductor 131*c* and a portion that extends therefrom to form another electrode of the storage capacitor Cst with overlapping the lower storage electrode 125*c* and the upper storage electrode 175*c*. The gate electrode 155*c* of the driving transistor T1 of the third pixel PXc may protrude to further include a protrusion connected (e.g., electrically connected) to the connecting member 176*c* through the opening formed in (or passing through) the third insulating layer 160. The upper storage electrode 175*c* may include a removed portion to be able to be connected (e.g., electrically connected) to the lower storage electrode 125*c* through the opening formed in (or passing through) the first insulating layer 120 and the third insulating layer 160.

The boundary line of the gate electrode 155*c* of the driving transistor T1 of the third pixel PXc may be positioned more to the inside than the boundary line of the lower storage electrode 125*c* and/or the boundary line of the upper storage electrode 175*c* that overlap the gate electrode 155*c* except for the protrusion thereof in a plan view. For example, the gate electrode 155*c* may have a structure that is protected by the lower storage electrode 125*c* and/or the upper storage electrode 175*c*, and the lower storage electrode 125*c* and/or the upper storage electrode 175*c* form parasitic capacitance with the pixel PXb adjacent thereto. This is because the gate electrode 155*c* of the driving transistor T1 of the third pixel PXc is covered by the lower storage electrode 125*c* and/or the upper storage electrode 175*c* positioned thereabove and therebelow, and this is because most of generated power lines are connected to the lower storage electrode 125*c* and/or the upper storage electrode 175*c* before entering the gate electrode 155*c*.

Referring to FIG. 2, the lower storage electrodes 125*a*, 125*b*, and 125*c* may have boundary lines positioned more inside than the upper storage electrodes 175*a*, 175*b*, and 175*c*. For example, the boundary lines of the lower storage electrodes 125*a*, 125*b*, and 125*c* may be positioned more inside than the boundary lines of the upper storage electrodes 175*a*, 175*b*, and 175*c* in a plan view. Although this will be separately described below, hydrogen or the like may be prevented from penetrating into the semiconductor layer ACT by covering the upper surface of the semiconductor layer ACT passing on the lower storage electrodes 125*a*, 125*b*, and 125*c* with the upper storage electrodes 175*a*, 175*b*, and 175*c*. In case that the semiconductor layer ACT crossing the lower storage electrodes 125*a*, 125*b*, and 125*c* is cut or in case that the inorganic insulating layer (e.g., 120, 140, or 160) is damaged due to the step (or the step difference) between the lower storage electrodes 125*a*, 125*b*, and 125*c*, the upper storage electrodes 175*a*, 175*b* and 175*c* may cover the upper surface of the broken portion, thereby preventing hydrogen from penetrating into the semiconductor layer ACT.

The input transistor T2 may have a channel, a first area, and a second area in the second semiconductor 132*a*, 132*b*, or 132*c* positioned on the first insulating layer 120, and the first area and the second area may be doped to have the same or similar conductive characteristics as a conductor. The first area of the second semiconductor 132*a*, 132*b*, or 132*c* may be connected (e.g., electrically connected) to the connecting member 177*a*, 177*b*, or 177*c* through the opening formed in (or passing through) the third insulating layer 160, and the connecting member 177*a*, 177*b*, or 177*c* may be connected (e.g., electrically connected) to the data line 171*a*, 171*b*, or 171*c* through the opening formed in (or passing through) the first insulating layer 120 and the third insulating layer 160 to receive the data voltage DVa, DVb, or DVc. The second area of the second semiconductor 132*a*, 132*b*, or 132*c* may be connected (e.g., electrically connected) to the opening formed in (or passing through) the third insulating layer 160 and the connecting member 176*a*, 176*b*, or 176*c*, and the connecting member 176*a*, 176*b*, or 176*c* may be connected (e.g., electrically connected) to the gate electrode 155*a*, 155*b*, or 155*c* through the openings formed in (or passing through) the third insulating layer 160. In some embodiments, the connecting member 176*a*, 176*b*, or 176*c* may extend toward the channel of the second semiconductor 132*a*, 132*b*, or 132*c* to cover the channel of the second semiconductor 132*a*, 132*b*, or 132*c*.

As shown in FIG. 2, the second semiconductor 132*a*, 132*b*, or 132*c* may not overlap the data line 171*a*, 171*b*, or 171*c*, e.g., in a plan view. The second semiconductors 132*a*, 132*b*, or 132*c* may not pass or cross the upper surface of the data line 171*a*, 171*b*, or 171*c*.

The second semiconductor 132*a*, 132*b*, or 132*c* may be connected to the data line 171*a*, 171*b*, or 171*c* through the connecting member 177*a*, 177*b*, or 177*c* positioned (or extending) along the x-axis direction. The connecting member 177*a*, 177*b*, or 177*c* may be positioned (or extending) along the x-axis direction, and the second semiconductor 132*a*, 132*b*, or 132*c* and the data line 171*a*, 171*b*, or 171*c* may be connected to each other through the opening overlapping the connecting member 177*a*, 177*b*, or 177*c*.

For example, the second semiconductor 132*a*, 132*b*, or 132*c* and the data line 171*a*, 171*b*, or 171*c* may be connected by the connecting member 177*a*, 177*b*, or 177*c* and may not overlap each other. Accordingly, a problem that the semiconductor layer ACT is cut or the inorganic insulating layer (e.g., 120, 140, or 160) on the semiconductor layer ACT is broken due to the step (or step difference) of the first conductive layer CL1 may be solved or prevented in case that the semiconductor layer ACT passes over the first conductive layer CL1. A specific effect will be separately described below.

The gate electrode 156 may be formed on the second semiconductor 132*a*, 132*b*, or 132*c*. For example, the second insulating layer 140 may be positioned between the second semiconductor 132*a*, 132*b*, or 132*c* and the gate electrode 156. In a plan view, a channel may be formed in the second semiconductor 132*a*, 132*b*, or 132*c* overlapping the gate electrode 156, and the channel may be covered by the gate electrode 156 such that the cannel may not be doped. The gate electrode 156 may extend to be connected (e.g., electrically connected) to the first scan signal line 151 positioned on the third conductive layer CL3 through the opening formed in (or passing through) the third insulating layer 160.

The initialization transistor T3 may have a channel, a first area, and a second area in the third semiconductor 133*a*, 133*b*, or 133*c* positioned on the first insulating layer 120, and the first area and the second area may be doped to have the same or similar conductive characteristics as a conductor. The first area of the third semiconductor 133*a*, 133*b*, or 133*c* may be connected to the protrusion 1751*a*, 1751*b*, or 1751*c* from which the upper storage electrode 175*a*, 175*b*, or 175*c* extends in the x-axis direction through the opening formed in (or passing through) the third insulating layer 160. For example, the upper storage electrode 175*a*, 175*b*, or 175*c* may be connected (e.g., electrically connected) to the lower storage electrode 125*a*, 125*b*, or 125*c* through the opening formed in (or passing through) the first insulating layer 120 and the third insulating layer 160, and may be connected (e.g., electrically connected) to the first semiconductor 131*a*, 131*b*, or 131*c* through the opening formed in (or passing through) the third insulating layer 160. The second area of the third semiconductor 133*a*, 133*b*, or 133*c* may be connected (e.g., electrically connected) to the initialization voltage connecting portion 173-3*v* through the opening formed in (or passing through) the third insulating layer 160 to receive the initialization voltage VINT. The gate electrode 157 may be formed on the third semiconductor 133*a*, 133*b*, or 133*c*. For example, the second insulating layer 140 may be positioned between the third semiconductor 133*a*, 133*b*, or 133*c* and the gate electrode 157. In a plan view, a channel may be formed in the third semiconductor 133*a*, 133*b*, or 133*c* overlapping the gate electrode 157, and the channel may be covered by the gate electrode 157 such that the channel may not be doped. The gate electrode 157 may extend to be connected (e.g., electrically connected) to the second scan signal line 151-1 positioned on the third conductive layer CL3 through the opening formed in (or passing through) the third insulating layer 160.

As shown in FIG. 2, the third semiconductor 133*a*, 133*b*, or 133*c* may not overlap the driving voltage line 172*v*. As shown in FIG. 2, the driving voltage line 172*v* may include a portion that is removed such that the driving voltage line 172*v* may not overlap the third semiconductor 133*a*. 133*b*, or 133*c*. The third semiconductor 133*a*, 133*b*, or 133*c* may not overlap the driving voltage line 172*v* and may not cross the driving voltage line 172*v*.

For example, the upper storage electrode 175*a*, 175*b*, or 175*c* may include a protrusion 1751*a*, 1751*b*, or 1751*c* extending and protruding in the x-axis direction. Each protrusion 1751*a*, 1751*b*, or 1751*c* may cross the driving voltage line 172*v* to overlap the third semiconductor 133*a*, 133*b*, or 133*c*. The protrusion 1751*a*, 1751*b*, or 1751*c* may be positioned between the driving voltage connecting portions 172-3*v* spaced apart from each other. Since the protrusion 1751*a*, 1751*b*, or 1751*c* is connected (e.g., electrically connected) to the third semiconductor 133*a*, 133*b*, or 133*c* through the opening, the third semiconductor 133*a*, 133*b*, or 133*c* may be connected (e.g., electrically connected) to the upper storage electrode 175*a*. 175*b*, or 175*c* without overlapping the driving voltage line 172*v*.

As the upper storage electrode 175*a*, 175*b*, or 175*c* is connected to the third semiconductor 133*a*, 133*b*, or 133*c* by the protrusion 1751*a*, 1751*b*, or 1751*c* extending and protruding in the x-axis direction as described above, the third semiconductor 133*a*, 133*b*, or 133*c* may not cross the driving voltage line 172*v* positioned (or included) in the first conductive layer CL1. Accordingly, the problem in which the semiconductor layer ACT is cut or the inorganic insulating layer (e.g., 120, 140, or 160) on the semiconductor layer ACT is cut due to the step (or step difference) of the first conductive layer CL1 may be solved or prevented.

The storage capacitor Cst may include a first storage capacitor Cst1 and a second storage capacitor Cst2.

The first storage capacitor Cst1 may be formed of the gate electrode 155*a*, 155*b*, or 155*c* positioned (or included) in the second conductive layer CL2, the third insulating layer 160 positioned thereon, and the upper storage electrode 175*a*, 175*b*, or 175*c* positioned thereon. The second storage capacitor Cst2 may be formed of the lower storage electrode 125*a*, 125*b*, or 125*c* positioned (or included) in the first conductive layer CL1, the first insulating layer 120 positioned thereon, and the gate electrode 155*a*, 155*b*, or 155*c* positioned thereon. As a result, the storage capacitor Cst may have a triple-layered structure of two storage electrodes (the upper storage electrode 175*a*, 175*b*, or 175*c* and the lower storage electrode 125*a*, 125*b*, or 125*c*) overlapping at upper and lower portions thereof in a plan view with using the gate electrode 155*a*, 155*b*, or 155*c* between the two storage electrodes.

The lower storage electrode 125*a*, 125*b*, or 125*c* and the upper storage electrode 175*a*. 175*b*, or 175*c* may be connected (e.g., electrically connected) to each other through opening formed in (or passing through) the first insulating layer 120 and the third insulating layer 160, and since the gate electrode 155*a*, 155*b*, or 155*c* is commonly included in the first storage capacitor Cst1 and the second storage capacitor Cst2, the first storage capacitor Cst1 and the second storage capacitor Cst2 may be connected in parallel in terms of a circuit structure. Since the circuit structure has a parallel-connected structure, total capacitance of the storage capacitor Cst may be a sum of capacitance of the first storage capacitor Cst1 and capacitance of the second storage capacitor Cst2.

The upper storage electrodes 175*a*, 175*b*, and 175*c* may be integral, and may be connected (e.g., electrically connected) to anodes of the light emitting diodes EDa, EDb, and EDc through openings 185*a*, 185*b*, and 185*c* formed in the fourth insulating layer 180. In some embodiments, an additional member (or anode connecting member) for connecting the upper storage electrodes 175*a*, 175*b*, and 175*c* and the anodes may be further included.

The light emitting diode EDa, EDb, or EDc may include an anode (e.g., 191 in FIG. 13), a light emitting layer (e.g., 370 in FIG. 13), and a cathode (e.g., 270 in FIG. 13), and the anode may be positioned on the fourth insulating layer 180. For example, a definition wall, e.g., a partition wall, (e.g., 350 in FIG. 13) may be formed to separate the light emitting diodes LED from each other, the definition wall 350 may expose the anode through an opening, the light emitting layer 370 may be formed through the exposed portion, and the cathode 270 may be formed thereon.

Figure 13:
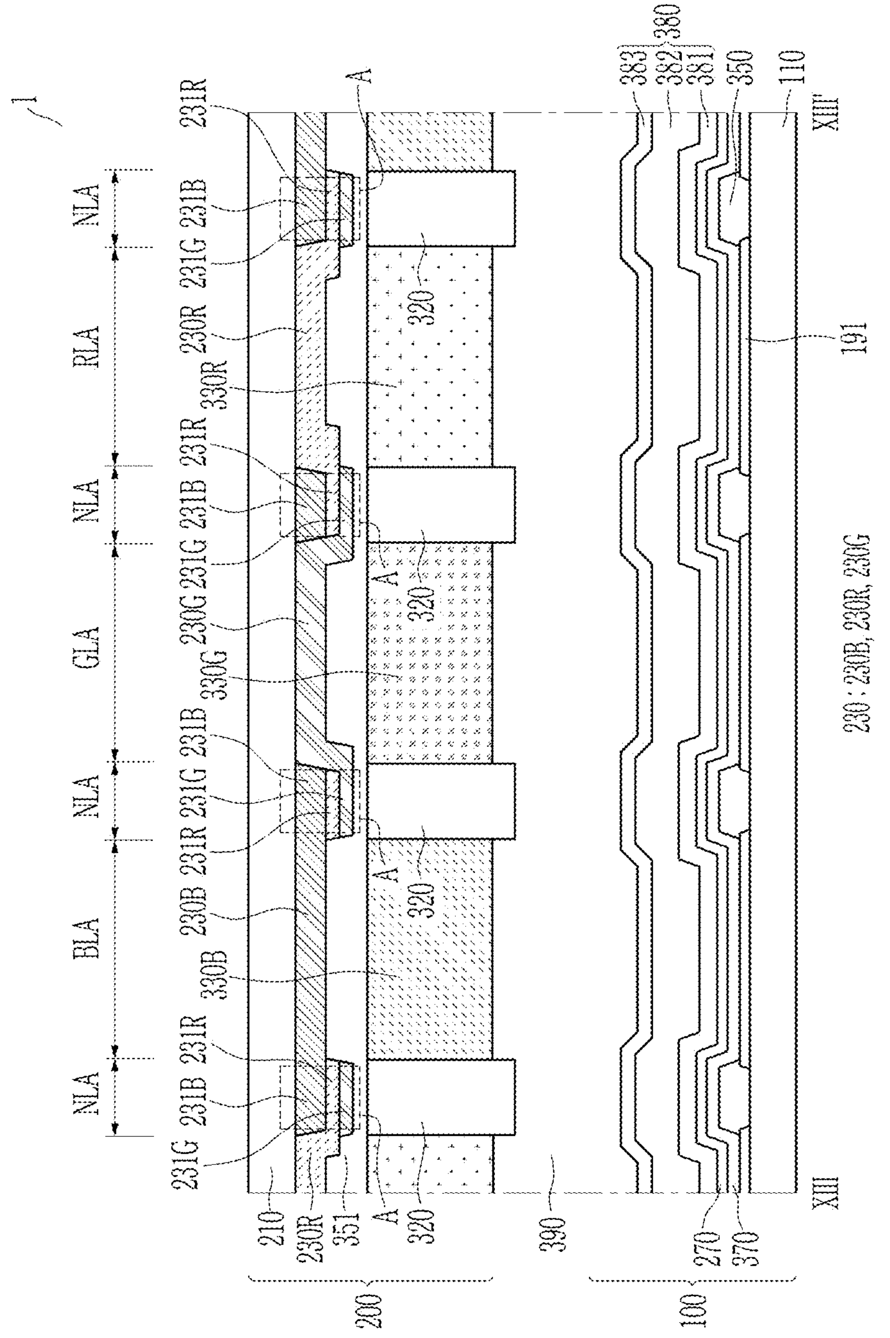
FIG. 13 illustrates a schematic cross-sectional view of a device according to an embodiment.

In some embodiments, the light emitting layer 370 may be formed only within the opening of the definition wall 350, but according to the embodiment of FIG. 13, the light emitting layer 370 may be also formed on the exposed anode 191 and the definition wall 350. The cathode 270 may be formed on the light emitting layer 370. According to the embodiment of FIG. 13, the light emitting layer 370 and the cathode 270 may be formed as a whole, so that a mask may not be used.

An encapsulation layer, a color conversion layer, or a color filter may be formed on the light emitting diodes EDa, EDb, and EDc, and this structure will be described with reference to FIG. 13 below.

The structure of the pixels PXa, PXb, and PXc of the display device 1 according to an embodiment has been described in detail.

The main feature of the invention may be to prevent damage to the semiconductor layer ACT and an inorganic layer ILD on the semiconductor layer ACT due to the step (or step difference) of the first conductive layer CL1 by preventing the semiconductor layer ACT from overlapping the first conductive layer CL1.

Referring to FIG. 3, the second semiconductor 132*a* may not overlap the data line 171*a* in a direction perpendicular to an upper surface of the first substrate 110.

Referring to FIG. 2 and FIG. 3, the data line 171*a* and the second semiconductor 132*a* may be connected to each other through the connecting member 177*a* overlapping both the data line 171*a* and the second semiconductor 132*a*. For example, an end portion (e.g., the left end portion) of the connecting member 177*a* may overlap the second semiconductor 132*a* in a plan view, and another end portion (e.g., the right end portion) of the connecting member 177*a* may overlap the data line 171*a* in a plan view. For example, the second semiconductor 132*a* may be connected to the data line 171*a* by the opening overlapping the connecting member 177*a* to receive a data voltage.

Referring to FIG. 5, the third semiconductor 133*a* may not overlap the driving voltage line 172*v* in the direction perpendicular to the upper surface of the first substrate 110. For example, the protrusion 1751*a* extending and protruding from the upper storage electrode 175*a* overlaps the driving voltage line 172*v* and the third semiconductor 133*a*. The third semiconductor 133*a* may be connected to the upper storage electrode 175*a* through the opening overlapping the protrusion 1751*a*.

Referring to FIG. 4, the first semiconductor 131*a* may be positioned to overlap the driving voltage line 172*v* and the lower storage electrode 125*a* that are included in the first conductive layer CL1. However, an edge portion of the first semiconductor 131*a* overlapping the driving voltage line 172*v* may be covered by the driving voltage connecting portion 172-3*v*. For example, a portion in which the first semiconductor 131*a* and the driving voltage line 172*v* start to overlap may be covered by the driving voltage connecting portion 172-3*v* that is included in the third conductive layer CL3. For example, an edge portion of the first semiconductor 131*a* overlapping the lower storage electrode 125*a* may be covered by the upper storage electrode 175*a* that is included in the third conductive layer CL3.

For example, in the portion in which the semiconductor layer ACT overlaps the first conductive layer CL1, as in the first semiconductor 131*a*, an upper portion of an overlapping boundary area may be covered by the third conductive layer CL3. Therefore, in case that the inorganic insulating layer (e.g., 120, 140, or 160) is broken at the overlapping portion thereafter, since the upper portion of the inorganic insulating layer (e.g., 120, 140, or 160) is covered with the third conductive layer CL3, a hydrogen penetration path may be blocked by the third conductive layer CL3.

For example, in the display device 1 according to an embodiment, as illustrated in FIG. 3 and FIG. 5, the second semiconductor 132*a* and the third semiconductor 133*a* may not partially overlap the first conductive layer CL1. Accordingly, in case that the second semiconductor 132*a* and the third semiconductor 133*a* overlap the first conductive layer CL1, the semiconductor layer ACT may be prevented from being damaged or the inorganic insulating layer (e.g., 120, 140, or 160) from being torn due to the step (or step difference) of the first conductive layer CL1.

As illustrated in FIG. 4, the edge portion of the area in which the first semiconductor 131*a* overlaps the first conductive layer CL1 may be covered by the third conductive layer CL3. For example, in case that the semiconductor layer ACT is damaged or the inorganic insulating layer (e.g., 120, 140, or 160) is torn due to the step (or step difference) of the first conductive layer CL1, since the torn area is covered by the third conductive layer CL3, hydrogen may be prevented from diffusing into the semiconductor layer ACT. For example, the diffusion path of hydrogen may be blocked by the third conductive layer CL3.

Figure 6:
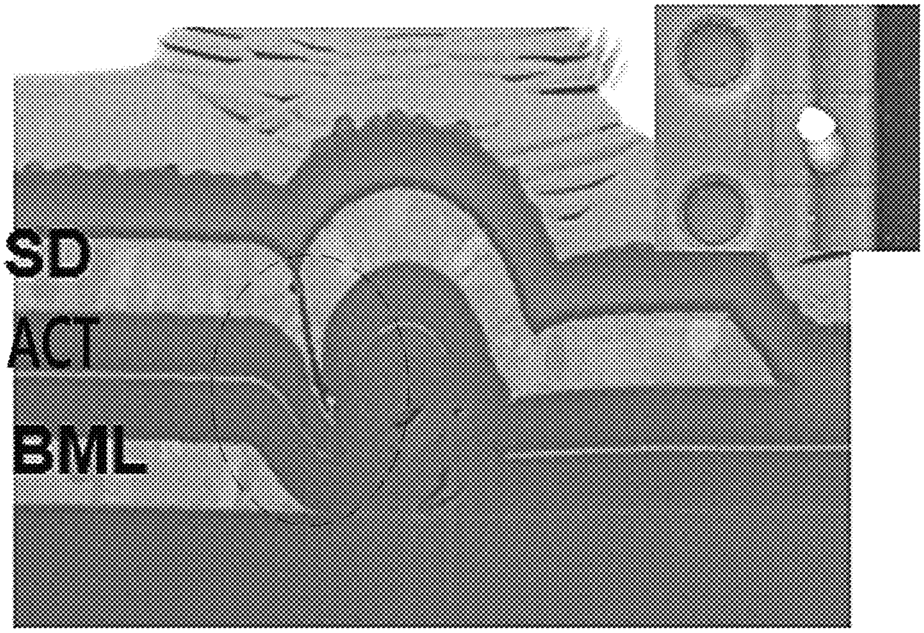
FIG. 6 and FIG. 7 illustrate images in which a semiconductor layer is damaged in case that a first conductive layer and the semiconductor layer overlap each other.
Figure 7:
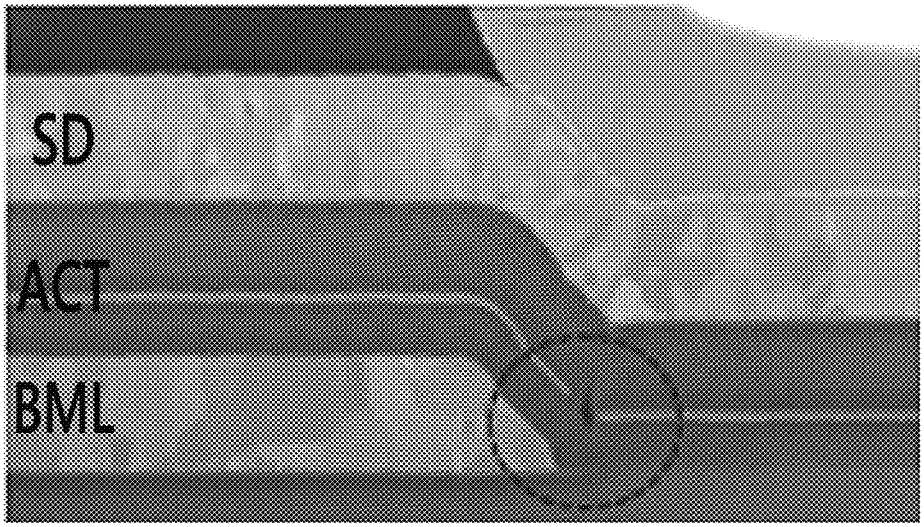

FIG. 6 and FIG. 7 illustrate images in which the semiconductor layer ACT is damaged in case that the first conductive layer CL1 and the semiconductor layer ACT overlap each other. As illustrated in FIG. 6, a semiconductor layer ACT may be positioned on a light blocking member BML, which is included in the first conductive layer CL1.

For example, a portion of the semiconductor layer ACT may be damaged due to a step (or step difference) of the light blocking member BML. In FIG. 6, the damaged portion is indicated by a dotted line circle.

Referring to FIG. 6, residual particles may occur at an end portion of the light blocking member BML, thereby deteriorating the coverage of the inorganic layer ILD on the semiconductor layer ACT. Accordingly, in case that the semiconductor layer ACT itself is broken or the semiconductor layer ACT is not broken, the coverage of the inorganic layer ILD formed on the semiconductor layer ACT may be deteriorated, and thus the inorganic layer ILD may be damaged.

In FIG. 7, the semiconductor layer ACT may be also positioned on the light blocking member BML, which is included in the first conductive layer CL1. For example, the light blocking member BML may be formed as a double film, for example, may be a Ti/Cu double film. For example, due to a difference in etch ratios of Ti and Cu, Cu may be pushed and formed inward compared with Ti, and a taper may not be uniform. The semiconductor layer ACT may be damaged or the inorganic layer ILD on the semiconductor layer ACT may be damaged by this non-uniform taper.

Referring to FIG. 6 and FIG. 7, in the case of the structure in which the semiconductor layer ACT overlaps the light blocking member BML, which is included in the first conductive layer CL1, the semiconductor layer ACT, the inorganic layer ILD, and a third conductive layer SD (or CL3) may be damaged at boundary surfaces thereof overlapping the first conductive layer CL1. As such, in the area in which the semiconductor layer ACT and the inorganic layer ILD are damaged, hydrogen or the like included in the upper organic layer may diffuse into the semiconductor layer ACT. For example, conductivity of the semiconductor layer ACT may be affected by hydrogen, and thus reliability of a transistor including the semiconductor layer ACT may be reduced or degraded.

Figure 8:
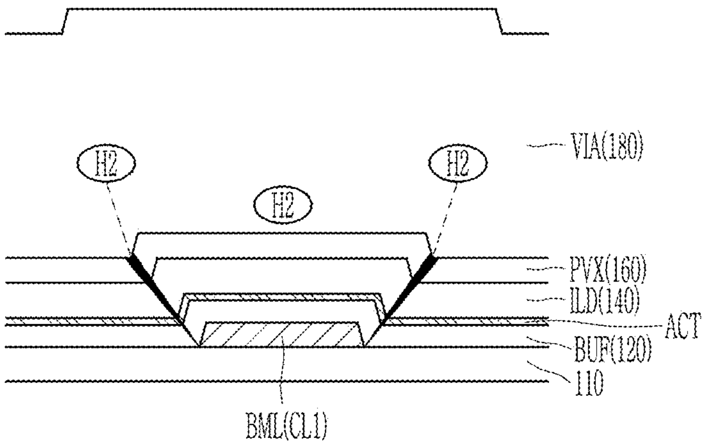
FIG. 8 illustrates a process in which hydrogen penetrates into a semiconductor layer due to damage to the semiconductor layer and an inorganic film.
Figure 9:
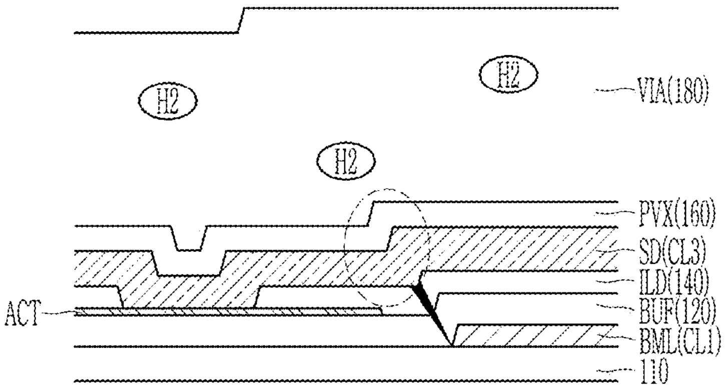
FIG. 9 schematically illustrates a case in which the semiconductor layer is connected to a third conductive layer without overlapping the first conductive layer as in the schematic cross-sectional views of FIG. 3 and FIG. 5.
Figure 10:
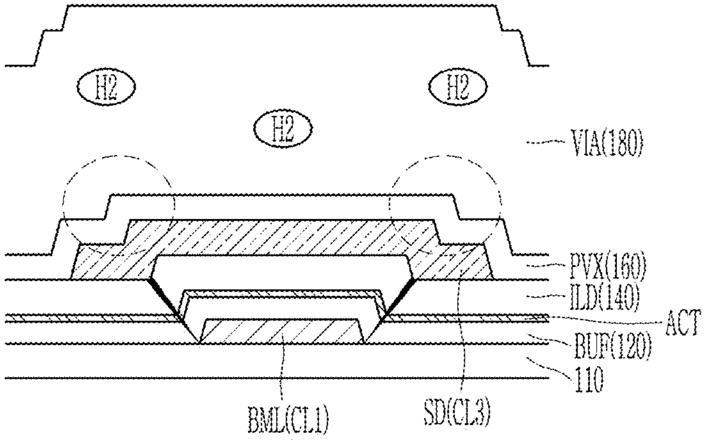
FIG. 10 schematically illustrates a case in which an upper portion of a portion in which the semiconductor layer overlaps the first conductive layer as in the schematic cross-sectional view of FIG. 4 is covered with a third conductive layer.

FIG. 8 illustrates a process in which hydrogen penetrates into the semiconductor layer ACT due to damage to the semiconductor layer ACT and an inorganic layer ILD. Referring to FIG. 8, the semiconductor layer ACT overlapping the light blocking member BML, which is included in the first conductive layer CL1, may be vulnerable to be damaged due to the step, the particles, the non-uniform taper, or the like of the light blocking member BML as described above. In case that the semiconductor layer ACT is damaged or the semiconductor layer ACT is not damaged, the inorganic layer ILD positioned thereon may be damaged. In FIG. 8 to FIG. 10, a buffer layer BUF may correspond to the first insulating layer 120, the inorganic layer ILD may correspond to the second insulating layer 140, a passivation layer PVX may correspond to the third insulating layer 160, and an organic layer VIA may correspond to the fourth insulating layer 180. In FIG. 8 and FIG. 10, the inorganic layer ILD is illustrated as being positioned on the entire semiconductor layer ACT, but in some embodiments, the inorganic layer ILD may be positioned on a channel area of the semiconductor layer ACT as a pattern.

In the stacked structure of the display device 1, the organic layer VIA may be positioned on the inorganic layer ILD, and the organic layer VIA may include hydrogens. For example, hydrogen included in the organic layer VIA may diffuse into the semiconductor layer ACT through the damaged inorganic layer ILD to affect performance of the transistor. In FIG. 8, a portion in which the inorganic layer ILD is damaged is shown in black.

However, in the display device 1 according to an embodiment, as discussed above, the second semiconductor 132*a* and the third semiconductor 133*a* may not overlap the first conductive layer CL1, and the portion in which the first semiconductor 131*a* overlaps the first conductive layer may be covered with the third conductive layer SD (or CL3), so that the diffusion of hydrogen may be prevented.

FIG. 9 schematically illustrates a case in which the semiconductor layer ACT is connected to the third conductive layer SD (or CL3) and does not overlap the first conductive layer CL1 as in the schematic cross-sectional views of FIG. 3 and FIG. 5. Referring to FIG. 9, the semiconductor layer ACT may not overlap the light blocking member BML, which is included in the first conductive layer CL1, and the semiconductor layer ACT may be connected to the third conductive layer SD and the semiconductor layer ACT. Accordingly, the semiconductor layer ACT may not be damaged by the step, particles, and non-uniform taper of the first conductive layer CL1. In FIG. 9, in case that the buffer layer BUF or the inorganic layer ILD is damaged at an edge portion of the light blocking member BML, which is included in the first conductive layer CL1, the damaged portion may be covered by the third conductive layer SD. Accordingly, the third conductive layer SD may block the penetration path of hydrogen included in the organic layer VIA. Therefore, hydrogen may not penetrate into the semiconductor layer ACT, and the transistor may stably operate.

FIG. 10 schematically illustrates a case in which an upper portion of a portion in which the semiconductor layer ACT overlaps the first conductive layer CL1 as in the schematic cross-sectional view of FIG. 4 is covered with the third conductive layer SD (or CL3). As shown in FIG. 10, the buffer layer BUF, the semiconductor layer ACT, or the inorganic layer ILD may be damaged in an area in which the semiconductor layer ACT overlaps the light blocking member BML, which is included in the first conductive layer CL1. However, as shown in FIG. 10, the boundary portion at which the above-mentioned damage occurs is covered by the third conductive layer SD. Accordingly, the penetration path of hydrogen included in the organic layer VIA may be blocked by the third conductive layer SD, thus the penetration of hydrogen into the semiconductor layer ACT may be reduced, and the transistor may stably operate.

In the above, the embodiment in which the upper portion of the boundary area in which the first semiconductors 131*a*, 131*b*, and 131*c* overlap the first conductive layer CL1 is covered by the third conductive layer SD (or CL3) and in which the portions of the second semiconductors 132*a*, 132*b*, and 132*c* and the third semiconductors 133*a*, 133*b*, and 133*c* may not overlap the first conductive layer CL1 has been described.

Figure 11:
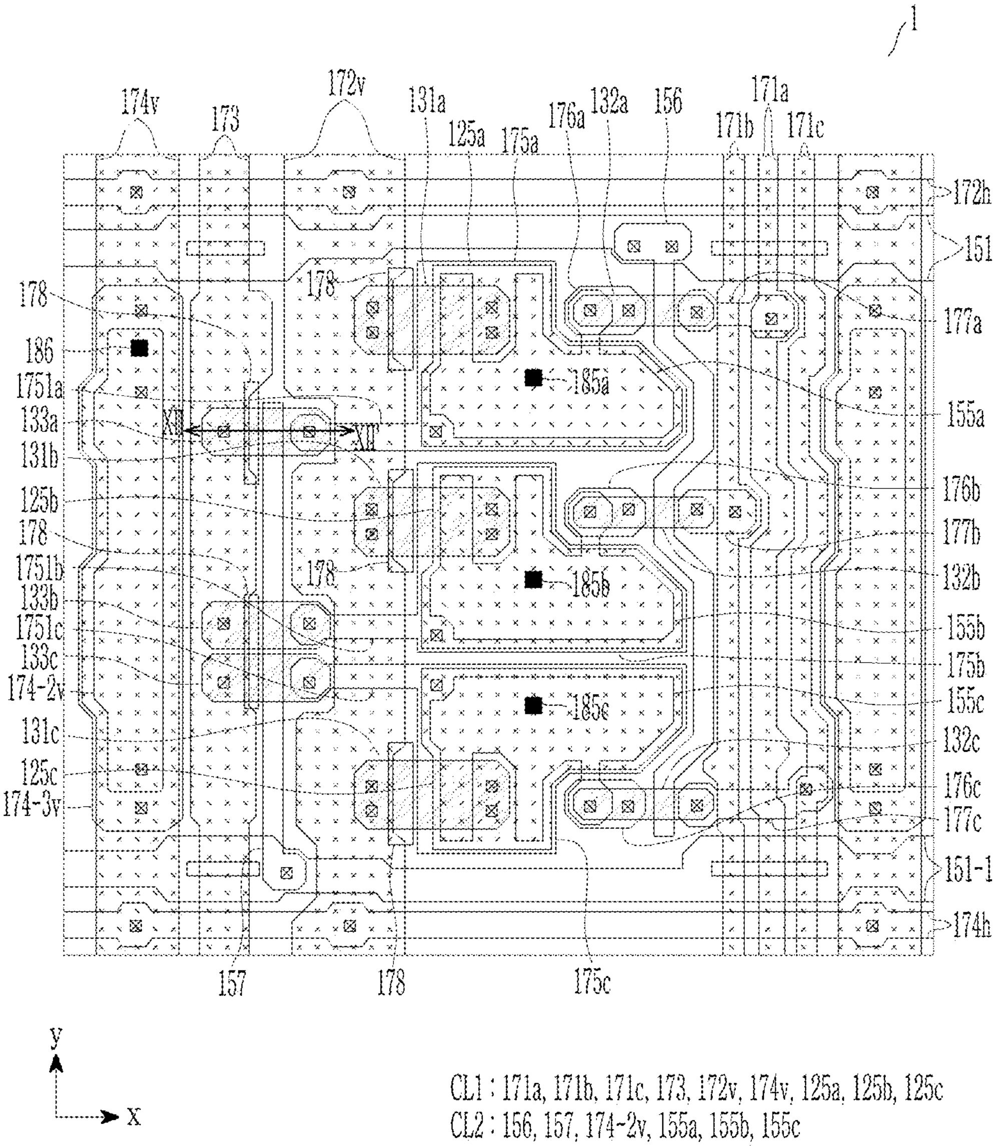
FIG. 11 illustrates a schematic layout view of a display device according to an embodiment.

FIG. 11 illustrates a schematic layout view of a display device 1 according to an embodiment. Referring to FIG. 11, the display device 1 according to an embodiment may not include the driving voltage connecting portion 172-3*v* and the initialization voltage connecting portion 173-3*v*, but may include a cover member 178 positioned at the boundary area where the semiconductor layer ACT and the first conductive layer CL1 overlap. As shown in FIG. 11, the cover member 178 may be formed in an area in which the first semiconductors 131*a*, 131*b*, and 131*c* and the driving voltage line 172*v*, which is included in the first conductive layer CL1, cross each other. As described above, in case that the semiconductor layer ACT passes over the first conductive layer CL1, the semiconductor layer ACT or the inorganic insulating layer (e.g., 120, 140, or 160) positioned on the semiconductor layer ACT may be damaged due to the step (or step difference) of the first conductive layer CL1. For example, due to the damage of the semiconductor layer ACT and the inorganic insulating layer (e.g., 120, 140, or 160), hydrogen and the like included in the upper organic layer may diffuse into the semiconductor layer ACT, thus the performance of the elements may be reduced.

However, in the display device 1 according to an embodiment, as shown in FIG. 11, the cover member 178 may be positioned at the boundary portion at which the first semiconductors 131*a*, 131*b*, and 131*c* and the driving voltage line 172*v* overlap. For example, the diffusion path of hydrogen may be blocked by covering the upper portion of the area in which the semiconductor layer ACT or the inorganic insulating layer (e.g., 120, 140, or 160) positioned on the semiconductor layer ACT may be damaged with the cover member 178.

For example, the cover member 178 may be also positioned at the boundary portion where the third semiconductors 133*a*, 133*b*, and 133*c* and the initialization voltage line 173 overlap. As shown in FIG. 11, the cover member 178 may be positioned at the boundary portion where the third semiconductors 133*a*, 133*b*, and 133*c* and the initialization voltage line 173 overlap. Accordingly, in case that the semiconductor layer ACT or the inorganic insulating layer (e.g., 120, 140, or 160) is damaged at the edge where the third semiconductors 133*a*, 133*b*, and 133*c* and the initialization voltage line 173 start to overlap, the hydrogen diffusion path may be blocked by the cover member 178, so the semiconductor layer ACT may stably operate.

Figure 12:
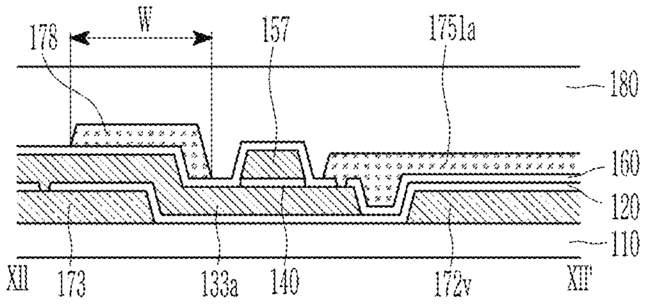
FIG. 12 illustrates a schematic cross-sectional view taken along line XII-XII' of FIG. 11.

FIG. 12 illustrates a schematic cross-sectional view taken along line XII-XII' of FIG. 11. Referring to FIG. 12, the cover member 178 may be positioned on the upper portion of the boundary portion where the third semiconductor 133*a* and the initialization voltage line 173 start to overlap. Accordingly, in case that the third semiconductor 133*a* is damaged by the step (or step difference) of the initialization voltage line 173, the residual particles, the non-uniform taper, and the like, inflow of hydrogen may be blocked by the cover member 178 to maintain performance of the transistor. For example, a width W of the cover member 178 may satisfy Equation 1 as follows.

$$W=\left(\text{Skew}+\sqrt{(CD\ \text{deviation})^2+(\text{Overlay torerance})^2}\right) \quad \text{[Equation 1]}$$

In Equation 1, the Skew may be a skew value during etching of the first and third conductive layers CL1 and CL3, and the CD deviation and the overlay tolerance may be unique values derived from each process. For example, the width W of the cover member 178 may vary according to materials and process situations of respective conductive layers included in the display device 1.

As described above, the display device 1 may connect the semiconductor layer ACT and the first conductive layer CL1 with the third conductive layer CL3 so that the semiconductor layer ACT and the first conductive layer CL1 may not overlap, or the third conductive layer CL3 may cover the boundary portion of the overlapping area of the semiconductor layer ACT and the first conductive layer CL1. Accordingly, the semiconductor layer ACT or the inorganic insulating layer (e.g., 120, 140, or 160) on the semiconductor layer ACT may be prevented from being damaged in the overlapping area of the semiconductor layer ACT and the first conductive layer CL1, and in case that the semiconductor layer ACT or the inorganic insulating layer (e.g., 120, 140, or 160) is damaged. For example, hydrogen may be prevented from diffusing into the semiconductor layer ACT by covering the upper portion of the damaged area with the third conductive layer CL3. Accordingly, the performance of the transistor may be stably maintained.

For example, in the display device 1, a light emitting diode including an anode, a light emitting layer, and a cathode may be formed on the fourth insulating layer, and an encapsulation layer, a color converting layer, or a color filter may be additionally included on the light emitting diode. Hereinafter, a cross-sectional structure of the display device 1 will be described in detail with reference to FIG. 13.

FIG. 13 illustrates a schematic cross-sectional view of the display device 1 according to an embodiment.

In FIG. 13, the pixel circuit part of the constituent elements of the display device 1 according to the embodiment described above is omitted for descriptive convenience, and the remaining constituent elements including the anode 191 forming the light emitting diodes EDa, EDb, and EDc are schematically shown.

The display device 1 according to FIG. 13 may include a display panel 100 and a color converting panel 200. Hereinafter, the display panel 100 will be first described.

As shown in FIG. 13, the anode 191 may be formed on the first substrate 110 for each of the pixels PXa, PXb, and PXc. The structure of the pixel circuit part including the transistors and the insulating layer positioned between the first substrate 110 and the anode 191 may be omitted for descriptive convenience, and for example, they may be disposed as shown in FIG. 2 to FIG. 5.

The definition wall 350 may be positioned on the anode 191, and the definition wall 350 may include an opening exposing a portion of the anode 191.

The light emitting layer 370 may be positioned on the anode 191 and the definition wall 350. In an embodiment, the light emitting layer 370 may be positioned on the entire area. For example, the light emitting layer 370 may be a light emitting layer that emits first color light (e.g., blue light). In some embodiments, the light emitting layer 370 may have a multi-layered structure. For example, the light emitting layer 370 may have a multi-layered structure emitting blue light and green light. In another example, the light emitting layer 370 may have a structure in which a layer emitting blue light is multi-layered. In some embodiments, the light emitting layer 370 may have a structure in which layers respectively emitting blue light, green light, and red light are stacked.

In some embodiments, the light emitting layers 370 may be formed to be separated from each other around the opening of each pixel. For example, the light emitting layers of respective pixels may emit light of different colors. The cathode 270 may be disposed (e.g., entirely disposed) on the light emitting layer 370.

The encapsulation layer 380 including insulating layers 381, 382, and 383 may be positioned on the cathode 270. The insulating layer 381 and the insulating layer 383 may include an inorganic insulating material, and the insulating layer 382 positioned between the insulating layer 381 and the insulating layer 383 may include an organic insulating material.

A filling layer 390 including a filler may be positioned on the encapsulation layer 380.

The filling layer 390 may be a layer for combining the display panel 100 including the first substrate 110 and the color converting panel 200 including a second substrate 210. Hereinafter, the color converting panel 200 will be described.

Referring to FIG. 13, the second substrate 210 may be positioned to face the first substrate 110. A color filter 230 including a blue color filter 230B, a red color filter 230R, and a green color filter 230G may be positioned on the second substrate 210.

Referring to FIG. 13, a blue dummy color filter 231B and the blue color filter 230B may be positioned on the same layer. The blue color filter 230B may be positioned in a blue light emitting area BLA, and the blue dummy color filter 231B may be positioned in a non-light emitting area NLA overlapping a bank 320. In FIG. 13, the blue color filter 230B and the blue dummy color filter 231B are illustrated as separate components, but may be connected to each other.

Figure 14:
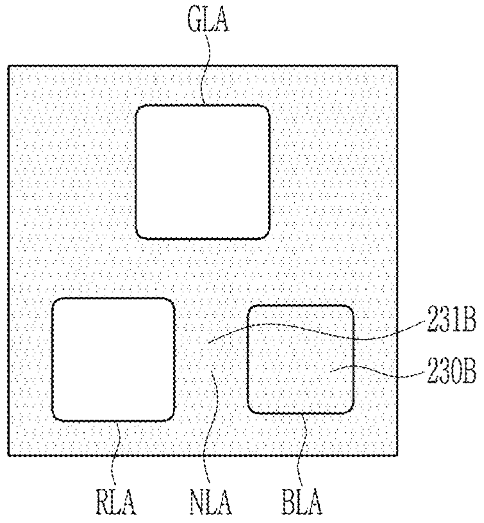
FIG. 14 to FIG. 16 illustrate steps of a color filter stacking process in the display device according to the embodiment of FIG. 13.
Figure 15:
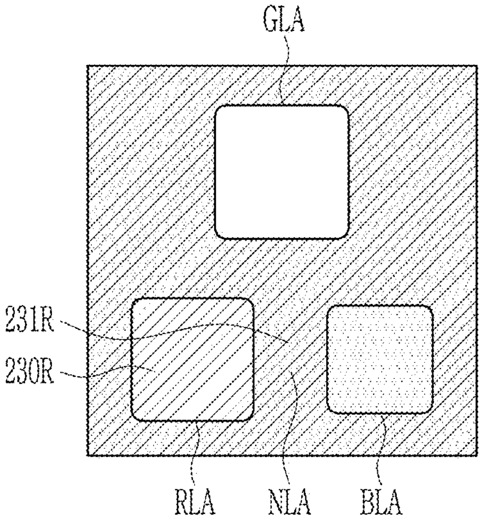
Figure 16:
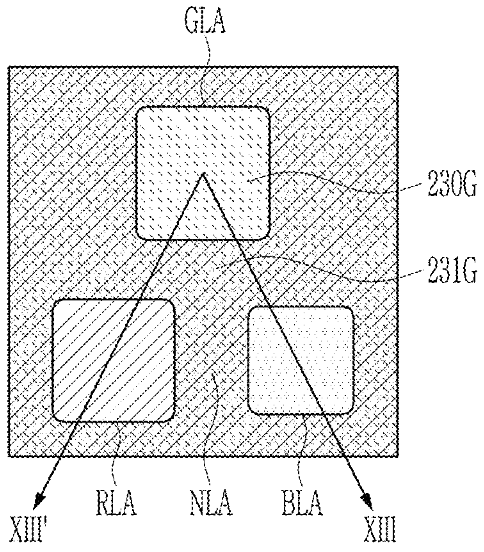

FIG. 14 to FIG. 16 illustrate a stacked order of the blue color filter 230B, the red color filter 230R, and the green color filter 230G. A schematic cross-sectional view taken along line XIII-XIII' in FIG. 16 may correspond to FIG. 13.

Referring to FIG. 14, the blue color filter 230B and the blue dummy color filter 231B may be positioned in all areas except for a green light emitting area GLA and a red light emitting area RLA. The blue color filter 230B may be positioned in the blue light emitting area BLA, and the blue dummy color filter 231B may be positioned in the non-light emitting area NLA.

Referring to FIG. 13 and FIG. 15 simultaneously, the red color filter 230R and the red dummy color filter 231R may be positioned on the blue color filter 230B and the blue dummy color filter 231B. Referring to FIG. 15, the red color filter 230R and the red dummy color filter 231R may be positioned in all areas except for the green light emitting area GLA and the red light emitting area RLA. The red color filter 230R may be positioned in the red light emitting area RLA, and the red dummy color filter 231R may be positioned in the non-light emitting area NLA.

Referring to FIG. 13 and FIG. 16 simultaneously, the green color filter 230G and a green dummy color filter 231G may be positioned on the blue color filter 230B and the blue dummy color filter 231B and on the red color filter 230R and the red dummy color filter 231R. Referring to FIG. 16, the green color filter 230G and the green dummy color filter 231G may be positioned in all areas except for the blue light emitting area BLA and the red light emitting area RLA. The green color filter 230G may be positioned in the green light emitting area GLA, and the green dummy color filter 231G may be positioned in the non-light emitting area NLA.

Referring to FIG. 13, the blue dummy color filter 231B, the red dummy color filter 231R, and the green dummy color filter 231G may be positioned to overlap in the area overlapping the bank 320. The blue dummy color filter 231B, the red dummy color filter 231R, and the green dummy color filter 231G may overlap to form a color filter overlapping body (A). The color filter overlapping body (A) may function the same as the light blocking member. For example, the color filter overlapping body (A) may block light in the non-light emitting area NLA.

For example, the blue dummy color filter 231B may be positioned closer to the second substrate 210 than the red dummy color filter 231R and the green dummy color filter 231G. A direction, in which a user views an image, is toward the second substrate 210, and the blue dummy color filter 231B may be positioned on a surface on which the image is viewed. This is because, blue light has a reflectance lower than green light or red light, and is effectively blocked as compared with green light or red light.

Referring to FIG. 13, a low refractive layer 351 may be positioned on the lower color filter 230. The low refractive layer 351 may have a refractive index of 1.2 or less. The low refractive layer 351 may be made of a mixture of an organic material and an inorganic material.

Banks 320 may be positioned on the low refractive layer 351. The banks 320 may be positioned to be spaced apart from each other with openings therebetween, and each opening may overlap each of the color filters 230R, 230G, and 230B in a direction perpendicular to the surface of the second substrate 210.

The bank 320 may include a scatterer. The scatterer may be one or more of $SiO_2$. $BaSO_4$, $Al_2O_3$, ZnO, $ZrO_2$, and $TiO_2$. The bank 320 may include a polymer resin and a scatterer included in the polymer resin. A content of the scatterer may be about 0.1 wt % to about 20 wt %. For example, the content of the scatterer may be about 5 wt % to about 10 wt %. The bank 320 including the scatterer may scatter the light emitted from the display panel to increase the luminous efficiency. In an embodiment, the bank 320 may include a black material to block light, and may prevent color mixing between neighboring light emitting areas.

A red color converting layer 330R and a transmissive layer 330B may be positioned in an area between the banks 320 spaced apart from each other. In FIG. 13, the red color converting layer 330R may be positioned in an area overlapping the red light emitting area RLA. The red color converting layer 330R may convert supplied light into red light. The red color converting layer 330R may include a quantum dot. For example, in FIG. 13, a green color converting layer 330G may be positioned in an area overlapping the green light emitting area GLA. The green color converting layer 330G may convert supplied light into green light. The green color converting layer 330G may include a quantum dot.

Hereinafter, the quantum dot will be described.

A core of the quantum dot may be selected from a group II-VI compound, a group III-V compound, a group IV-VI compound, a group IV element, a group IV compound, and a combination thereof.

The Group II-VI compound may be selected from a two-element compound selected from CdSe, CdTe, ZnS, ZnSe, ZnTe, ZnO, HgS, HgSe, HgTe, MgSe, MgS, and a mixture thereof; a three-element compound selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from a two-element compound selected from GaN, GaP, GaAs, GaSb, AlN, AlP, AlAs, AlSb, InN, InP, InAs, InSb, and a mixture thereof; a three-element compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a four-element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from a two-element compound selected from SnS, SnSc, SnTe, PbS, PbSe, PbTe, and a mixture thereof; a three-element compound selected from SnSeS, SnSeTe, SnSTe, PbSeS, PbSeTe, PbSTe, SnPbS, SnPbSe, SnPbTe, and a mixture thereof; and a four-element compound selected from SnPbSSe, SnPbSeTe, SnPbSTe, and a mixture thereof. The Group IV element may be selected from Si, Ge, and a mixture thereof. The Group IV compound may be a two-element compound selected from SiC, SiGe, and a mixture thereof.

For example, the two-element compound, the three-element compound, or the four-element compound may be included in particles at uniform concentrations, or they may be divided into states having partially different concentrations to be included in the same particle, respectively. For example, a core/shell structure in which some quantum dots enclose some other quantum dots may be applied. An interface between the core and the shell may have a concentration gradient in which a concentration of elements of the shell decreases closer to its center.

In some embodiments, the quantum dot may have a core-shell structure that includes a core including the nanocrystal described above and a shell surrounding the core. The shell of the quantum dot may function as a passivation layer for maintaining a semiconductor characteristic and/or as a charging layer for applying an electrophoretic characteristic to the quantum dot by preventing chemical denaturation of the core. The shell may be a single layer or a multilayer. An interface between the core and the shell may have a concentration gradient in which a concentration of elements of the shell decreases closer to the center thereof. An example of the shell of the quantum dot may include a metal or nonmetal oxide, a semiconductor compound, or a combination thereof.

For example, the metal or non-metal oxide may be a binary element compound such as $SiO_2$. $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like, or a ternary element compound such as $MgAl_2O_4$, $CoFe_2O_4$, $NiFe_2O_4$, $CoMn_2O_4$, and the like, but embodiments are not limited thereto.

The semiconductor compound may be CdS, CdSe, CdTe, ZnS, ZnSe, ZnTe, ZnSeS, ZnTeS, GaAs, GaP, GaSb, HgS, HgSc, HgTe, InAs, InP. InGaP, InSb, AlAs, AlP. AlSb, or the like, but embodiments are not limited thereto.

The quantum dot may have a full width at half maximum (FWHM) of the light-emitting wavelength spectrum that is equal to or less than about 45 nm, e.g., equal to or less than about 40 nm, and, e.g., equal to or less than about 30 nm, and in this range, color purity or color reproducibility may be improved. Since light emitted through the quantum dot is emitted in all directions, a viewing angle of light may be improved.

Further, a shape of the quantum dot is not limited to a shape used in the art, and may have a spherical, pyramidal, multi-arm, cubic nanoparticle, nanotube, nano-wire, nanofiber, nano-plate particle shape, and the like.

The quantum dot may control a color of emitted light according to a particle size thereof, and thus the quantum dot may have various light emitting colors such as blue, red, and green colors.

Referring to FIG. 13, any color converting layer may not be positioned in a portion corresponding to the blue light emitting area BLA among spaces defined by the bank 320. For example, the transmissive layer 330B may be positioned. The transmissive layer 330B may include a scatterer. The scatterer may be one or more of $SiO_2$, $BaSO_4$, $Al_2O_3$, ZnO, $ZrO_2$, and $TiO_2$. The transmissive layer 330B may include a polymer resin and a scatterer included in the polymer resin. For example, the transmissive layer 330B may include $TiO_2$, but embodiments are not limited thereto. The transmissive layer 330B may transmit light incident from the display panel.

As described above, in the color converting panel according to an embodiment and the display device 1 including the color converting panel, the red light emitting area RLA may convert the incident light to red light to emit the converted red light. The green light emitting area GLA may convert the incident light into green light to emit the converted green light. However, the blue light emitting area BLA may transmit the incident light without color conversion. The incident light may include blue light. The incident light may be blue light alone or a mixture of blue light and green light. In another example, it may include all of blue light, green light, and red light.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:
a substrate;
a first conductive layer disposed on the substrate and including a data line, an initialization voltage line, and a driving voltage line; and
a semiconductor layer disposed on the first conductive layer, wherein
the semiconductor layer includes a first semiconductor, a second semiconductor, and a third semiconductor spaced apart from each other,
the first semiconductor is electrically connected to the driving voltage line,
the second semiconductor is electrically connected to the data line,
the third semiconductor is electrically connected to the initialization voltage line, and
the second semiconductor does not overlap the data line in a direction perpendicular to a surface of the substrate.

2. The display device of claim 1, further comprising:
a second conductive layer disposed on the semiconductor layer; and
a third conductive layer disposed on the second conductive layer and including a connecting member, wherein
the connecting member overlaps the second semiconductor and the data line, and
the second semiconductor and the data line are electrically connected through the connecting member.

3. The display device of claim 2, wherein
the data line extends along a second direction, and
the connecting member extends along a first direction intersecting the second direction.

4. The display device of claim 2, wherein the driving voltage line extends along a second direction,
the third conductive layer further includes an upper storage electrode disposed between the data line and the driving voltage line in a plan view, and
the upper storage electrode includes a protrusion protruding in a first direction intersecting the second direction.

5. The display device of claim 4, wherein the protrusion of the upper storage electrode extends to cross the driving voltage line.

6. The display device of claim 5, wherein the protrusion of the upper storage electrode is electrically connected to the third semiconductor.

7. The display device of claim 6, wherein the third semiconductor does not overlap the driving voltage line.

8. The display device of claim 6, wherein the third semiconductor overlaps the initialization voltage line and is electrically connected to the initialization voltage line.

9. The display device of claim 8, wherein an edge of the third semiconductor overlaps the initialization voltage line and the third conductive layer.

10. The display device of claim 8, wherein
the third conductive layer further includes an initialization voltage connecting portion overlapping the initialization voltage line, and
an edge portion of the third semiconductor overlaps the initialization voltage line and the initialization voltage connecting portion.

11. The display device of claim 2, wherein an edge portion of the first semiconductor overlaps the driving voltage line and the third conductive layer.

12. The display device of claim 11, wherein
the third conductive layer includes a driving voltage connecting portion overlapping the driving voltage line, and
an edge portion of the first semiconductor overlaps the driving voltage line and the driving voltage connecting portion.

13. The display device of claim 4, wherein
the first conductive layer further includes a lower storage electrode overlapping the upper storage electrode, and
a side of the lower storage electrode is disposed inside a boundary of the upper storage electrode in a plan view.

14. The display device of claim 13, wherein an edge portion of the first semiconductor overlaps the lower storage electrode and the upper storage electrode.

15. A display device comprising:
a substrate;
a first conductive layer disposed on the substrate and including a data line, an initialization voltage line, and a driving voltage line;
a semiconductor layer disposed on the first conductive layer; and
a second conductive layer disposed on the semiconductor layer and including a cover member, wherein
the semiconductor layer includes a first semiconductor, a second semiconductor, and a third semiconductor spaced apart from each other,
the first semiconductor is electrically connected to the driving voltage line,
the second semiconductor is electrically connected to the data line,
the third semiconductor is electrically connected to the initialization voltage line, and an edge portion of the first semiconductor overlaps the driving voltage line and the cover member.

16. The display device of claim 15, wherein the cover member is not electrically connected to the first conductive layer.

17. The display device of claim 15, wherein the third semiconductor does not overlap the driving voltage line.

18. The display device of claim 15, wherein the first conductive layer further includes an upper storage electrode disposed between the data line and the driving voltage line in a plan view, the upper storage electrode includes a protrusion, and the protrusion of the upper storage electrode overlaps the third semiconductor.

19. The display device of claim 15, wherein the second semiconductor does not overlap the first conductive layer.

20. The display device of claim 15, wherein an edge portion of the third semiconductor overlaps the initialization voltage line and the cover member.

* * * * *